US012713943B2

(12) United States Patent
Huang et al.

(10) Patent No.: US 12,713,943 B2
(45) Date of Patent: Aug. 18, 2026

(54) DIELETS ON FLEXIBLE AND STRETCHABLE PACKAGING FOR MICROELECTRONICS

(71) Applicant: ADEIA SEMICONDUCTOR TECHNOLOGIES LLC, San Jose, CA (US)

(72) Inventors: Shaowu Huang, Sunnyvale, CA (US); Javier A. Delacruz, San Jose, CA (US)

(73) Assignee: Adeia Semiconductor Technologies LLC, San Jose, CA (US)

( * ) Notice: Subject to any disclaimer, the term of this patent is extended or adjusted under 35 U.S.C. 154(b) by 0 days.

(21) Appl. No.: 17/749,442

(22) Filed: May 20, 2022

(65) Prior Publication Data

US 2022/0278048 A1 Sep. 1, 2022

Related U.S. Application Data

(63) Continuation of application No. 16/515,417, filed on Jul. 18, 2019, now Pat. No. 11,355,443, which is a (Continued)

(51) Int. Cl.
*H01L 23/538* (2006.01)
*H10W 70/05* (2026.01)
(Continued)

(52) U.S. Cl.
CPC .......... *H10W 70/611* (2026.01); *H10W 70/05* (2026.01); *H10W 70/65* (2026.01);
(Continued)

(58) Field of Classification Search
CPC ............. H01L 23/5387; H01L 21/4846; H01L 23/49894; H01L 23/5386; H01L 24/08;
(Continued)

(56) References Cited

U.S. PATENT DOCUMENTS 4,467,342 A 8/1984 Tower
4,998,665 A 3/1991 Hayashi
(Continued)

FOREIGN PATENT DOCUMENTS

CN 201407528 Y * 2/2010
CN 103681646 3/2014
(Continued)

OTHER PUBLICATIONS

Office Action for U.S. Appl. No. 16/515,417, mailed on Feb. 12, 2021, Huang, "Dielets on Flexible and Stretchable Packaging for Microelectronics", 9 Pages.
(Continued)

*Primary Examiner* — Ermias T Woldegeorgis
(74) *Attorney, Agent, or Firm* — Knobbe, Martens, Olson & Bear, LLP

(57) ABSTRACT

Dielets on flexible and stretchable packaging for microelectronics are provided. Configurations of flexible, stretchable, and twistable microelectronic packages are achieved by rendering chip layouts, including processors and memories, in distributed collections of dielets implemented on flexible and/or stretchable media. High-density communication between the dielets is achieved with various direct-bonding or hybrid bonding techniques that achieve high conductor count and very fine pitch on flexible substrates. An example process uses high-density interconnects direct-bonded or hybrid bonded between standard interfaces of dielets to create a flexible microelectronics package. In another example, a process uses high-density interconnections direct-bonded between native interconnects of the dielets to create the flexible microelectronics packages, without the standard interfaces.

28 Claims, 9 Drawing Sheets

SIDE VIEW

FRONT VIEW

Related U.S. Application Data continuation of application No. 15/970,055, filed on May 3, 2018, now Pat. No. 10,403,577.

(51) Int. Cl.

| | |
|---|---|
| ***H10W 70/60*** | (2026.01) |
| ***H10W 70/65*** | (2026.01) |
| ***H10W 70/67*** | (2026.01) |
| ***H10W 70/69*** | (2026.01) |
| ***H10W 90/00*** | (2026.01) |
| *H10W 80/00* | (2026.01) |
| *H10W 90/10* | (2026.01) |

(52) U.S. Cl.

CPC ......... *H10W 70/688* (2026.01); *H10W 70/69* (2026.01); *H10W 90/00* (2026.01); *H10W 70/093* (2026.01); *H10W 80/312* (2026.01); *H10W 80/327* (2026.01); *H10W 90/10* (2026.01); *H10W 90/794* (2026.01)

(58) Field of Classification Search

CPC ..... H01L 24/24; H01L 24/82; H01L 25/0652; H01L 25/0655; H01L 2224/08225; H01L 2224/24137; H01L 2224/80895; H01L 2224/80896; H01L 2224/82896; H01L 2224/82897; H01L 24/32; H01L 2224/32225; H01L 2224/83894; H01L 24/96; H01L 24/83; H01L 21/568; H01L 23/3121; H01L 2924/3511; H10W 70/611; H10W 70/05; H10W 70/65; H10W 70/688; H10W 70/69; H10W 90/00; H10W 70/093; H10W 80/312; H10W 80/327; H10W 90/10; H10W 90/794; H10W 72/0198; H10W 72/07331; H10W 90/734; H10W 74/019; H10W 74/114

See application file for complete search history.

(56) References Cited

U.S. PATENT DOCUMENTS 5,019,673 A 5/1991 Juskey et al.
5,051,802 A 9/1991 Prost et al.
5,087,585 A 2/1992 Hayashi
5,322,593 A 6/1994 Hasegawa et al.
5,399,898 A 3/1995 Rostoker
5,729,896 A 3/1998 Dalal et al.
5,753,536 A 5/1998 Sugiyama et al.
5,771,555 A 6/1998 Eda et al.
5,854,507 A 12/1998 Miremadi et al.
5,956,605 A 9/1999 Akram et al.
5,985,739 A 11/1999 Plettner et al.
5,998,808 A 12/1999 Matsushita
6,008,126 A 12/1999 Leedy
6,080,640 A 6/2000 Gardner et al.
6,121,688 A 9/2000 Akagawa
6,265,775 B1 7/2001 Seyyedy
6,322,903 B1 11/2001 Siniaguine et al.
6,374,770 B1 4/2002 Lee
6,410,983 B1 6/2002 Moriizumi et al.
6,423,640 B1 7/2002 Lee et al.
6,437,434 B1 8/2002 Sugizaki
6,448,153 B2 9/2002 Siniaguine
6,465,892 B1 10/2002 Suga
6,500,694 B1 12/2002 Enquist
6,582,991 B1 6/2003 Maeda et al.
6,686,665 B1 2/2004 Gao et al.
6,768,208 B2 7/2004 Lin et al.
6,782,610 B1 8/2004 Iijima et al.
6,867,073 B1 3/2005 Enquist
6,887,769 B2 5/2005 Kellar et al.
6,908,027 B2 6/2005 Tolchinsky et al.
6,958,285 B2 10/2005 Siniaguine
6,964,915 B2 11/2005 Farnworth et al.
6,984,889 B2 1/2006 Kimura
7,045,453 B2 5/2006 Canaperi et al.
7,078,811 B2 7/2006 Suga
7,098,542 B1 8/2006 Hoang et al.
7,105,980 B2 9/2006 Abbott et al.
7,126,212 B2 10/2006 Enquist et al.
7,193,423 B1 3/2007 Dalton et al.
7,319,197 B2 1/2008 Oggioni et al.
7,354,798 B2 4/2008 Pogge et al.
7,385,283 B2 6/2008 Wu et al.
7,452,743 B2 11/2008 Oliver et al.
7,554,203 B2 6/2009 Zhou et al.
7,582,971 B2 9/2009 Kameyama et al.
7,589,409 B2 9/2009 Gibson et al.
7,663,231 B2 2/2010 Chang et al.
7,750,488 B2 7/2010 Patti et al.
7,759,751 B2 7/2010 Ono
7,786,572 B2 8/2010 Chen
7,803,693 B2 9/2010 Trezza
7,816,856 B2 10/2010 Cok et al.
7,902,643 B2 3/2011 Tuttle
7,977,789 B2 7/2011 Park
8,008,764 B2 8/2011 Joseph et al.
8,049,303 B2 11/2011 Osaka et al.
8,064,224 B2 11/2011 Mahajan et al.
8,168,458 B2 5/2012 Do et al.
8,178,963 B2 5/2012 Yang
8,178,964 B2 5/2012 Yang
8,183,127 B2 5/2012 Patti et al.
8,193,632 B2 6/2012 Chang et al.
8,227,904 B2 7/2012 Braunisch et al.
8,237,289 B2 8/2012 Urakawa
8,241,961 B2 8/2012 Kim et al.
8,258,633 B2 9/2012 Sezi et al.
8,263,434 B2 9/2012 Pagaila et al.
8,314,007 B2 11/2012 Vaufredaz
8,349,635 B1 1/2013 Gan et al.
8,377,798 B2 2/2013 Peng et al.
8,409,927 B1 4/2013 Yim
8,441,131 B2 5/2013 Ryan
8,476,146 B2 7/2013 Chen et al.
8,476,165 B2 7/2013 Trickett et al.
8,482,132 B2 7/2013 Yang et al.
8,501,537 B2 8/2013 Sadaka et al.
8,519,514 B2 8/2013 Fujii
8,524,533 B2 9/2013 Tong et al.
8,536,693 B2 9/2013 Dungan et al.
8,618,659 B2 12/2013 Sato et al.
8,620,164 B2 12/2013 Heck et al.
8,647,987 B2 2/2014 Yang et al.
8,691,601 B2 4/2014 Izuha
8,697,493 B2 4/2014 Sadaka
8,703,542 B2 4/2014 Lin et al.
8,704,364 B2 4/2014 Banijamali
8,704,384 B2 4/2014 Wu et al.
8,710,648 B2 4/2014 Xue
8,716,105 B2 5/2014 Sadaka et al.
8,791,575 B2 7/2014 Oganesian et al.
8,802,538 B1 8/2014 Liu
8,809,123 B2 8/2014 Liu et al.
8,810,006 B2 8/2014 Yu et al.
8,816,404 B2 8/2014 Kim et al.
8,841,002 B2 9/2014 Tong
8,872,349 B2 10/2014 Chiu et al.
8,878,353 B2 11/2014 Haba et al.
8,901,748 B2 12/2014 Manusharow et al.
8,912,648 B2 12/2014 Lin et al.
8,912,670 B2 12/2014 Teh et al.
8,975,726 B2 3/2015 Chen et al.
8,987,137 B2 3/2015 Bachman et al.
8,988,299 B2 3/2015 Kam et al.
9,006,873 B2 4/2015 Nikitin et al.
9,018,094 B2 4/2015 Kosenko et al.
9,048,306 B2 6/2015 Chi et al.
9,059,179 B2 6/2015 Karikalan et al.
9,093,350 B2 7/2015 Endo et al.
9,126,236 B2 9/2015 Roos et al.

(56) References Cited

U.S. PATENT DOCUMENTS 9,136,219 B2 9/2015 Iwase et al.
9,136,293 B2 9/2015 Yee et al.
9,142,517 B2 9/2015 Liu et al.
9,153,552 B2 10/2015 Teh et al.
9,159,690 B2 10/2015 Chiu
9,171,756 B2 10/2015 Enquist et al.
9,171,816 B2 10/2015 Teh et al.
9,184,104 B1 11/2015 Chia et al.
9,184,125 B2 11/2015 Enquist et al.
9,190,380 B2 11/2015 Teh et al.
9,202,769 B2 12/2015 Lin et al.
9,224,669 B2 12/2015 Xue
9,224,704 B2 12/2015 Landru
9,230,941 B2 1/2016 Chen et al.
9,252,172 B2 2/2016 Chow et al.
9,257,399 B2 2/2016 Kuang et al.
9,269,701 B2 2/2016 Starkston et al.
9,275,971 B2 3/2016 Chiu et al.
9,299,736 B2 3/2016 Chen et al.
9,312,229 B2 4/2016 Chen et al.
9,331,149 B2 5/2016 Tong et al.
9,337,235 B2 5/2016 Chen et al.
9,349,703 B2 5/2016 Chiu et al.
9,355,997 B2 5/2016 Katkar et al.
9,368,563 B2 6/2016 Lin et al.
9,368,866 B2 6/2016 Yu
9,379,091 B2 6/2016 England et al.
9,385,024 B2 7/2016 Tong et al.
9,391,143 B2 7/2016 Tong et al.
9,394,161 B2 7/2016 Cheng et al.
9,402,312 B2 7/2016 Shen et al.
9,412,662 B2 8/2016 Lin et al.
9,431,368 B2 8/2016 Enquist et al.
9,431,371 B2 8/2016 Karikalan et al.
9,437,572 B2 9/2016 Chen et al.
9,443,796 B2 9/2016 Chou et al.
9,443,824 B1 9/2016 We et al.
9,461,007 B2 10/2016 Chun et al.
9,466,586 B1 10/2016 Choi et al.
9,476,898 B2 10/2016 Takano
9,496,239 B1 11/2016 Edelstein et al.
9,536,848 B2 1/2017 England et al.
9,559,081 B1 1/2017 Lai et al.
9,564,414 B2 2/2017 Enquist et al.
9,589,947 B2 3/2017 Hwang et al.
9,601,353 B2 3/2017 Huang et al.
9,620,481 B2 4/2017 Edelstein et al.
9,627,365 B1 4/2017 Yu et al.
9,656,852 B2 5/2017 Cheng et al.
9,666,502 B2 5/2017 Chen et al.
9,666,559 B2 5/2017 Wang et al.
9,704,824 B2 7/2017 Lin et al.
9,704,827 B2 7/2017 Huang et al.
9,716,033 B2 7/2017 Enquist et al.
9,722,098 B1 8/2017 Chung et al.
9,723,716 B2 8/2017 Meinhold
9,728,521 B2 8/2017 Tsai et al.
9,741,620 B2 8/2017 Uzoh et al.
9,799,587 B2 10/2017 Fujii et al.
9,852,988 B2 12/2017 Enquist et al.
9,881,882 B2 1/2018 Hsu et al.
9,893,004 B2 2/2018 Yazdani
9,899,442 B2 2/2018 Katkar
9,929,050 B2 3/2018 Lin
9,941,180 B2 4/2018 Kim et al.
9,941,241 B2 4/2018 Edelstein et al.
9,941,243 B2 4/2018 Kim et al.
9,953,941 B2 4/2018 Enquist
9,960,142 B2 5/2018 Chen et al.
9,966,360 B2 5/2018 Yu et al.
10,008,844 B2 6/2018 Wang et al.
10,026,605 B2 7/2018 Doub et al.
10,032,722 B2 7/2018 Yu et al.
10,074,630 B2 9/2018 Kelly et al.
10,075,657 B2 9/2018 Fahim et al.
10,204,893 B2 2/2019 Uzoh et al.
10,269,756 B2 4/2019 Uzoh
10,269,853 B2 4/2019 Katkar et al.
10,276,619 B2 4/2019 Kao et al.
10,276,909 B2 4/2019 Huang et al.
10,403,577 B1 9/2019 Huang et al.
10,418,277 B2 9/2019 Cheng et al.
10,434,749 B2 10/2019 Tong
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,559,507 B1 2/2020 Saketi et al.
10,707,087 B2 7/2020 Uzoh et al.
10,727,204 B2 7/2020 Agarwal et al.
10,727,219 B2 7/2020 Uzoh et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,037,919 B2 6/2021 Uzoh et al.
11,056,348 B2 7/2021 Theil
11,056,390 B2 7/2021 Uzoh et al.
11,069,734 B2 7/2021 Katkar
11,088,099 B2 8/2021 Katkar et al.
11,127,738 B2 9/2021 DeLaCruz et al.
11,145,626 B2 10/2021 Hwang et al.
11,158,573 B2 10/2021 Uzoh et al.
11,158,606 B2 10/2021 Gao et al.
11,169,326 B2 11/2021 Huang et al.
11,171,117 B2 11/2021 Gao et al.
11,176,450 B2 11/2021 Teig et al.
11,195,748 B2 12/2021 Uzoh et al.
11,205,625 B2 12/2021 DeLaCruz et al.
11,244,920 B2 2/2022 Uzoh
11,256,004 B2 2/2022 Haba et al.
11,264,357 B1 3/2022 DeLaCruz et al.
11,276,676 B2 3/2022 Enquist et al.
11,296,044 B2 4/2022 Gao et al.
11,296,053 B2 4/2022 Uzoh et al.
11,329,034 B2 5/2022 Tao et al.
11,348,898 B2 5/2022 DeLaCruz et al.
11,355,404 B2 6/2022 Gao et al.
11,355,443 B2 6/2022 Huang et al.
11,367,652 B2 6/2022 Uzoh et al.
11,373,963 B2 6/2022 DeLaCruz et al.
11,380,597 B2 7/2022 Katkar et al.
11,385,278 B2 7/2022 DeLaCruz et al.
11,387,202 B2 7/2022 Haba et al.
11,387,214 B2 7/2022 Wang et al.
11,393,779 B2 7/2022 Gao et al.
11,462,419 B2 10/2022 Haba
11,471,999 B2 10/2022 Kumar et al.
11,476,213 B2 10/2022 Haba et al.
11,515,291 B2 11/2022 DeLaCruz et al.
11,538,781 B2 12/2022 Haba
11,626,363 B2 4/2023 Haba et al.
11,631,647 B2 4/2023 Haba
2002/0000328 A1 1/2002 Motomura et al.
2002/0003307 A1 1/2002 Suga
2002/0004288 A1 1/2002 Nishiyama
2002/0074668 A1 6/2002 Hofstee et al.
2004/0070045 A1 4/2004 Suguro et al.

(56) References Cited

U.S. PATENT DOCUMENTS

2004/0084414 A1 5/2004 Sakai et al.
2004/0157407 A1 8/2004 Tong et al.
2004/0238927 A1 12/2004 Miyazawa
2005/0040530 A1 2/2005 Shi
2005/0133930 A1 6/2005 Savastisuk et al.
2005/0153522 A1 7/2005 Hwang et al.
2005/0218518 A1 10/2005 Jiang et al.
2006/0057945 A1 3/2006 Hsu et al.
2006/0087042 A1 4/2006 Kameyama et al.
2006/0278331 A1 12/2006 Dugas et al.
2007/0045798 A1 3/2007 Horie et al.
2007/0080442 A1 4/2007 Meyer-Berg
2007/0096294 A1 5/2007 Ikeda et al.
2007/0111386 A1 5/2007 Kim et al.
2007/0122635 A1 5/2007 Lu et al.
2007/0158024 A1 7/2007 Addison et al.
2007/0158827 A1 7/2007 Schuster
2007/0222048 A1 9/2007 Huang
2007/0295456 A1 12/2007 Gudeman et al.
2008/0079105 A1 4/2008 Chang et al.
2008/0231311 A1 9/2008 Condorelli et al.
2008/0237782 A1 10/2008 Williams et al.
2008/0244902 A1 10/2008 Blackwell et al.
2008/0265421 A1 10/2008 Brunnbauer et al.
2008/0308928 A1 12/2008 Chang
2009/0039523 A1 2/2009 Jiang et al.
2009/0068831 A1 3/2009 Enquist et al.
2009/0072357 A1 3/2009 Tang et al.
2009/0102002 A1 4/2009 Chia et al.
2009/0149023 A1 6/2009 Koyanagi
2009/0227089 A1 9/2009 Plaut et al.
2009/0252939 A1 10/2009 Park et al.
2009/0283898 A1 11/2009 Janzen et al.
2009/0321939 A1 12/2009 Chandrasekaran
2010/0081236 A1 4/2010 Yang et al.
2010/0123268 A1 5/2010 Menard
2010/0129999 A1 5/2010 Zingher et al.
2010/0167534 A1 7/2010 Iwata
2010/0176482 A1 7/2010 Dennard et al.
2010/0213603 A1 8/2010 Smeys et al.
2010/0213819 A1 8/2010 Cok et al.
2010/0225005 A1 9/2010 Nishio et al.
2010/0230806 A1 9/2010 Huang et al.
2010/0258952 A1 10/2010 Fjelstad
2010/0259166 A1* 10/2010 Cok .................... H10K 59/131 313/506
2010/0314741 A1 12/2010 Lee et al.
2010/0327424 A1 12/2010 Braunisch et al.
2011/0062549 A1 3/2011 Lin
2011/0074033 A1 3/2011 Kaltalioglu et al.
2011/0095403 A1 4/2011 Lee et al.
2011/0108943 A1 5/2011 Dennard et al.
2011/0163457 A1 7/2011 Mohan et al.
2011/0290552 A1 12/2011 Palmateer et al.
2012/0001339 A1 1/2012 Malatkar
2012/0049332 A1 3/2012 Chen et al.
2012/0074585 A1 3/2012 Koo et al.
2012/0187516 A1 7/2012 Sato
2012/0194719 A1 8/2012 Churchwell et al.
2012/0199960 A1 8/2012 Cosue et al.
2012/0212384 A1 8/2012 Kam et al.
2012/0319300 A1 12/2012 Kim et al.
2013/0037962 A1 2/2013 Xue
2013/0069239 A1 3/2013 Kim et al.
2013/0122655 A1 5/2013 Yu et al.
2013/0161836 A1 6/2013 Yeom et al.
2013/0187292 A1 7/2013 Semmelmeyer et al.
2013/0217188 A1 8/2013 Wang et al.
2013/0249045 A1 9/2013 Kang et al.
2013/0249106 A1 9/2013 Lin et al.
2013/0265733 A1 10/2013 Herbsommer et al.
2013/0299997 A1 11/2013 Sadaka
2013/0320572 A1 12/2013 Chang et al.
2014/0001652 A1 1/2014 Chen et al.
2014/0013606 A1 1/2014 Nah et al.
2014/0015109 A1 1/2014 Lei et al.
2014/0071652 A1 3/2014 McShane et al.
2014/0124957 A1 5/2014 Iwase et al.
2014/0134804 A1 5/2014 Kelly et al.
2014/0145558 A1 5/2014 Hori et al.
2014/0154839 A1 6/2014 Ahn et al.
2014/0175655 A1 6/2014 Chen et al.
2014/0225246 A1 8/2014 Henderson et al.
2014/0225795 A1 8/2014 Yu
2014/0299981 A1 10/2014 Goh et al.
2014/0312511 A1 10/2014 Nakamura
2014/0370658 A1 12/2014 Tong et al.
2015/0021754 A1 1/2015 Lin et al.
2015/0041980 A1 2/2015 Ahn et al.
2015/0064498 A1 3/2015 Tong
2015/0102468 A1 4/2015 Kang et al.
2015/0113195 A1 4/2015 Kim
2015/0115448 A1 4/2015 Maier
2015/0123240 A1 5/2015 Bowman et al.
2015/0171050 A1 6/2015 Chen et al.
2015/0179481 A1 6/2015 Lin
2015/0194406 A1 7/2015 Teh et al.
2015/0228632 A1 8/2015 Yu et al.
2015/0262845 A1 9/2015 Hwang et al.
2015/0262928 A1 9/2015 Shen et al.
2015/0303170 A1 10/2015 Kim et al.
2015/0327367 A1 11/2015 Shen et al.
2015/0340285 A1 11/2015 Enquest et al.
2016/0020193 A1 1/2016 Lee et al.
2016/0042998 A1 2/2016 Pueschner et al.
2016/0126634 A1 5/2016 Liu et al.
2016/0133571 A1 5/2016 Lee et al.
2016/0163650 A1 6/2016 Gao et al.
2016/0172302 A1 6/2016 Song et al.
2016/0190103 A1 6/2016 Kabe et al.
2016/0247761 A1 8/2016 Song et al.
2016/0260684 A1 9/2016 Zhai et al.
2016/0300813 A1 10/2016 Zhai et al.
2016/0300817 A1 10/2016 Do et al.
2016/0322330 A1 11/2016 Lin et al.
2016/0327977 A1 11/2016 Tang et al.
2016/0329284 A1 11/2016 We et al.
2016/0343682 A1 11/2016 Kawasaki
2016/0343685 A1 11/2016 Lin et al.
2016/0379885 A1 12/2016 Uzoh et al.
2017/0062366 A1 3/2017 Enquist
2017/0062383 A1 3/2017 Yee et al.
2017/0079135 A1* 3/2017 Hu ........................ H01L 21/486
2017/0125379 A1 5/2017 Chen et al.
2017/0148764 A1 5/2017 Wang et al.
2017/0148777 A1* 5/2017 Bono ...................... H01L 33/32
2017/0179029 A1 6/2017 Enquist et al.
2017/0179078 A1 6/2017 Jung et al.
2017/0194271 A1 7/2017 Hsu et al.
2017/0200711 A1 7/2017 Uzoh et al.
2017/0263595 A1 9/2017 Kurita et al.
2017/0316998 A1 11/2017 Marutani et al.
2017/0338214 A1 11/2017 Uzoh et al.
2017/0345763 A1 11/2017 Cheah et al.
2017/0365580 A1 12/2017 Shih et al.
2018/0005984 A1 1/2018 Yu et al.
2018/0005992 A1 1/2018 Yu et al.
2018/0012787 A1 1/2018 Oka et al.
2018/0026008 A1 1/2018 Jeng et al.
2018/0026227 A1 1/2018 Kim et al.
2018/0053746 A1 2/2018 Yu et al.
2018/0096931 A1 4/2018 Huang et al.
2018/0102251 A1* 4/2018 Delacruz ................ H01L 21/82
2018/0122774 A1 5/2018 Huang et al.
2018/0122777 A1 5/2018 Wong et al.
2018/0130769 A1 5/2018 Tan et al.
2018/0130772 A1 5/2018 Yu et al.
2018/0138101 A1 5/2018 Yu et al.
2018/0174995 A1 6/2018 Wang et al.
2018/0175012 A1 6/2018 Wu et al.
2018/0182639 A1 6/2018 Uzoh et al.
2018/0182666 A1 6/2018 Uzoh et al.
2018/0190580 A1 7/2018 Haba et al.
2018/0190583 A1 7/2018 DeLaCruz et al.

(56) References Cited

U.S. PATENT DOCUMENTS

2018/0191047 A1 7/2018 Huang et al.
2018/0219038 A1 8/2018 Gambino et al.
2018/0226375 A1 8/2018 Enquist et al.
2018/0273377 A1 9/2018 Katkar et al.
2018/0286805 A1 10/2018 Huang et al.
2018/0294212 A1 10/2018 Chen et al.
2018/0323177 A1 11/2018 Yu et al.
2018/0323227 A1 11/2018 Zhang et al.
2018/0331066 A1 11/2018 Uzoh et al.
2018/0337157 A1 11/2018 Wang et al.
2018/0366437 A1 12/2018 Chen et al.
2018/0366442 A1 12/2018 Gu et al.
2018/0366446 A1 12/2018 Haba et al.
2019/0096741 A1 3/2019 Uzoh et al.
2019/0096842 A1 3/2019 Fountain, Jr. et al.
2019/0115277 A1 4/2019 Yu et al.
2019/0131277 A1 5/2019 Yang et al.
2019/0148269 A1 5/2019 Cheah et al.
2019/0189607 A1 6/2019 Uzoh et al.
2019/0198407 A1 6/2019 Huang et al.
2019/0198409 A1 6/2019 Katkar et al.
2019/0206791 A1 7/2019 Pietambaram et al.
2019/0221548 A1 7/2019 Huang et al.
2019/0265411 A1 8/2019 Huang et al.
2019/0273039 A1 9/2019 Im
2019/0333550 A1 10/2019 Fisch
2019/0333871 A1 10/2019 Chen et al.
2019/0348336 A1 11/2019 Katkar et al.
2019/0371763 A1 12/2019 Agarwal et al.
2019/0385935 A1 12/2019 Gao et al.
2019/0385966 A1 12/2019 Gao et al.
2019/0385981 A1 12/2019 Chen et al.
2020/0006309 A1 1/2020 Chen et al.
2020/0013637 A1 1/2020 Haba
2020/0013667 A1 1/2020 Leobandung
2020/0013765 A1 1/2020 Fountain, Jr. et al.
2020/0035641 A1 1/2020 Fountain, Jr. et al.
2020/0043853 A1 2/2020 Kim et al.
2020/0058617 A1 2/2020 Wu et al.
2020/0075520 A1 3/2020 Gao et al.
2020/0075534 A1 3/2020 Gao et al.
2020/0075553 A1 3/2020 DeLaCruz et al.
2020/0118973 A1 4/2020 Wang et al.
2020/0126906 A1 4/2020 Uzoh et al.
2020/0135684 A1 4/2020 Kim et al.
2020/0176419 A1 6/2020 Dabral et al.
2020/0194396 A1 6/2020 Uzoh
2020/0227367 A1 7/2020 Haba et al.
2020/0243380 A1 7/2020 Uzoh et al.
2020/0243455 A1 7/2020 Wang et al.
2020/0279821 A1 9/2020 Haba et al.
2020/0294908 A1 9/2020 Haba et al.
2020/0294920 A1 9/2020 Hariri et al.
2020/0303361 A1 9/2020 Shih et al.
2020/0328162 A1 10/2020 Haba et al.
2020/0328164 A1 10/2020 DeLaCruz et al.
2020/0328165 A1 10/2020 DeLaCruz et al.
2020/0335357 A1 10/2020 Rogers et al.
2020/0335408 A1 10/2020 Gao et al.
2020/0371154 A1 11/2020 DeLaCruz et al.
2020/0395300 A1 12/2020 Xie et al.
2020/0395321 A1 12/2020 Katkar et al.
2020/0403006 A1 12/2020 DeLaCruz et al.
2020/0411483 A1 12/2020 Uzoh et al.
2021/0020577 A1 1/2021 Hu
2021/0028080 A1 1/2021 Pietambaram et al.
2021/0057343 A1 2/2021 Chang et al.
2021/0057352 A1 2/2021 Agarwal et al.
2021/0066219 A1 3/2021 Chen et al.
2021/0082797 A1 3/2021 Lee et al.
2021/0082822 A1 3/2021 Aleksov et al.
2021/0082825 A1 3/2021 Strong et al.
2021/0091063 A1 3/2021 Ninomiya et al.
2021/0098411 A1 4/2021 Liff et al.
2021/0098412 A1 4/2021 Haba et al.
2021/0098421 A1 4/2021 Wu et al.
2021/0111125 A1 4/2021 Chen et al.
2021/0118864 A1 4/2021 DeLaCruz et al.
2021/0125933 A1 4/2021 Chen et al.
2021/0125965 A1 4/2021 Lu
2021/0134724 A1 5/2021 Rubin et al.
2021/0143125 A1 5/2021 DeLaCruz et al.
2021/0181510 A1 6/2021 Katkar et al.
2021/0183847 A1 6/2021 Uzoh et al.
2021/0193603 A1 6/2021 Katkar et al.
2021/0193624 A1 6/2021 DeLaCruz et al.
2021/0193625 A1 6/2021 DeLaCruz et al.
2021/0202396 A1 7/2021 Wu et al.
2021/0225780 A1 7/2021 Wu et al.
2021/0242152 A1 8/2021 Fountain, Jr. et al.
2021/0280507 A1 9/2021 Aldrete et al.
2021/0280517 A1 9/2021 May et al.
2021/0280522 A1 9/2021 Liu
2021/0296282 A1 9/2021 Gao et al.
2021/0305122 A1 9/2021 Lai et al.
2021/0305202 A1 9/2021 Uzoh et al.
2021/0335726 A1 10/2021 Wu et al.
2021/0343690 A1 11/2021 Salmon
2021/0358875 A1 11/2021 Lee et al.
2021/0366820 A1 11/2021 Uzoh
2021/0366970 A1 11/2021 Katkar
2021/0375708 A1 12/2021 Kuo et al.
2021/0375737 A1 12/2021 Lin
2021/0384133 A1 12/2021 Ong et al.
2021/0384135 A1 12/2021 Kuan et al.
2021/0391271 A1 12/2021 Hsu et al.
2021/0391272 A1 12/2021 Tsai et al.
2021/0391283 A1 12/2021 Hsu et al.
2021/0391284 A1 12/2021 Hsu et al.
2021/0407941 A1 12/2021 Haba
2022/0005787 A1 1/2022 Han et al.
2022/0020716 A1 1/2022 Liff et al.
2022/0077063 A1 3/2022 Haba
2022/0077087 A1 3/2022 Haba
2022/0122934 A1 4/2022 Haba
2022/0130738 A1 4/2022 Cobb et al.
2022/0139867 A1 5/2022 Uzoh
2022/0139869 A1 5/2022 Gao et al.
2022/0149002 A1 5/2022 Hou et al.
2022/0208650 A1 6/2022 Gao et al.
2022/0208702 A1 6/2022 Uzoh
2022/0208723 A1 6/2022 Katkar et al.
2022/0246497 A1 8/2022 Fountain, Jr. et al.
2022/0278084 A1 9/2022 Ong et al.
2022/0285303 A1 9/2022 Mirkarimi et al.
2022/0319901 A1 10/2022 Suwito et al.
2022/0320035 A1 10/2022 Uzoh et al.
2022/0320036 A1 10/2022 Gao et al.
2022/0328467 A1 10/2022 Chen et al.
2022/0336436 A1 10/2022 Zhang et al.
2022/0375864 A1 11/2022 Wang et al.
2022/0392881 A1 12/2022 Yu et al.
2023/0005850 A1 1/2023 Fountain, Jr.
2023/0012157 A1 1/2023 Yu et al.
2023/0019869 A1 1/2023 Mirkarimi et al.
2023/0036441 A1 2/2023 Haba et al.
2023/0067190 A1 3/2023 Lung
2023/0067677 A1 3/2023 Lee et al.
2023/0069183 A1 3/2023 Haba
2023/0079607 A1 3/2023 Ecton et al.
2023/0100032 A1 3/2023 Haba et al.
2023/0115122 A1 4/2023 Uzoh et al.
2023/0122531 A1 4/2023 Uzoh
2023/0123423 A1 4/2023 Gao et al.
2023/0125395 A1 4/2023 Gao et al.
2023/0130259 A1 4/2023 Haba et al.
2023/0132632 A1 5/2023 Katkar et al.
2023/0140107 A1 5/2023 Uzoh et al.
2023/0142680 A1 5/2023 Guevara et al.
2023/0154816 A1 5/2023 Haba et al.
2023/0154828 A1 5/2023 Haba et al.
2023/0161120 A1 5/2023 Yu et al.
2023/0187264 A1 6/2023 Uzoh et al.
2023/0187317 A1 6/2023 Uzoh

(56) References Cited

U.S. PATENT DOCUMENTS

| | | | |
|---|---|---|---|
| 2023/0187412 | A1 | 6/2023 | Gao et al. |
| 2023/0197453 | A1 | 6/2023 | Fountain, Jr. et al. |
| 2023/0197496 | A1 | 6/2023 | Theil |
| 2023/0197554 | A1 | 6/2023 | Lan et al. |
| 2023/0197559 | A1 | 6/2023 | Haba et al. |
| 2023/0197560 | A1 | 6/2023 | Katkar et al. |
| 2023/0197655 | A1 | 6/2023 | Theil et al. |
| 2023/0207402 | A1 | 6/2023 | Fountain, Jr. et al. |
| 2023/0207437 | A1 | 6/2023 | Haba |
| 2023/0207474 | A1 | 6/2023 | Uzoh et al. |
| 2023/0207514 | A1 | 6/2023 | Gao et al. |
| 2023/0215836 | A1 | 7/2023 | Haba et al. |
| 2023/0245950 | A1 | 8/2023 | Haba et al. |
| 2023/0268300 | A1 | 8/2023 | Uzoh et al. |
| 2023/0299029 | A1 | 9/2023 | Theil et al. |
| 2023/0343734 | A1 | 10/2023 | Uzoh et al. |
| 2023/0360950 | A1 | 11/2023 | Gao |
| 2023/0361074 | A1 | 11/2023 | Uzoh et al. |
| 2023/0369136 | A1 | 11/2023 | Uzoh et al. |
| 2023/0375613 | A1 | 11/2023 | Haba et al. |
| 2024/0038702 | A1 | 2/2024 | Uzoh |
| 2024/0055407 | A1 | 2/2024 | Workman |
| 2024/0063135 | A1 | 2/2024 | Ng et al. |
| 2024/0079376 | A1 | 3/2024 | Suwito et al. |
| 2024/0088101 | A1 | 3/2024 | Gao et al. |
| 2024/0105674 | A1 | 3/2024 | Uzoh et al. |
| 2024/0170411 | A1 | 5/2024 | Chang et al. |
| 2024/0186248 | A1 | 6/2024 | Haba et al. |
| 2024/0186250 | A1 | 6/2024 | Ecton et al. |
| 2024/0186268 | A1 | 6/2024 | Uzoh et al. |
| 2024/0186269 | A1 | 6/2024 | Haba |
| 2024/0203917 | A1 | 6/2024 | Katkar et al. |
| 2024/0213191 | A1 | 6/2024 | Theil et al. |
| 2024/0213210 | A1 | 6/2024 | Haba et al. |
| 2024/0217210 | A1 | 7/2024 | Zhao et al. |
| 2024/0222239 | A1 | 7/2024 | Gao et al. |
| 2024/0222315 | A1 | 7/2024 | Uzoh |
| 2024/0222319 | A1 | 7/2024 | Gao et al. |
| 2024/0266255 | A1 | 8/2024 | Haba et al. |
| 2024/0298454 | A1 | 9/2024 | Haba |
| 2024/0304593 | A1 | 9/2024 | Uzoh |
| 2024/0312951 | A1 | 9/2024 | Theil et al. |
| 2024/0332184 | A1 | 10/2024 | Katkar et al. |
| 2024/0332227 | A1 | 10/2024 | Uzoh et al. |
| 2024/0332231 | A1 | 10/2024 | Uzoh |
| 2024/0332267 | A1 | 10/2024 | Haba et al. |
| 2024/0337800 | A1 | 10/2024 | Yu et al. |
| 2024/0387419 | A1 | 11/2024 | Mrozek et al. |
| 2025/0004197 | A1 | 1/2025 | Haba et al. |
| 2025/0006632 | A1 | 1/2025 | Chang et al. |
| 2025/0006642 | A1 | 1/2025 | Haba et al. |
| 2025/0006674 | A1 | 1/2025 | Uzoh et al. |
| 2025/0006679 | A1 | 1/2025 | Theil et al. |
| 2025/0006689 | A1 | 1/2025 | Uzoh et al. |
| 2025/0054854 | A1 | 2/2025 | Katkar et al. |
| 2025/0079364 | A1 | 3/2025 | Uzoh et al. |
| 2025/0096191 | A1 | 3/2025 | Gao et al. |
| 2025/0112123 | A1 | 4/2025 | Katkar et al. |
| 2025/0185163 | A1 | 6/2025 | Zhao et al. |
| 2025/0210585 | A1 | 6/2025 | Fountain, Jr. et al. |
| 2025/0212554 | A1 | 6/2025 | Katkar et al. |
| 2025/0273517 | A1 | 8/2025 | Lee et al. |
| 2025/0391762 | A1 | 12/2025 | Uzoh |
| 2025/0391794 | A1 | 12/2025 | Uzoh |
| 2026/0053023 | A1 | 2/2026 | Haba |

FOREIGN PATENT DOCUMENTS

| | | | | |
|---|---|---|---|---|
| CN | 113782520 A | 12/2021 | | |
| CN | 113809018 A | 12/2021 | | |
| CN | 114203679 A | 3/2022 | | |
| EP | 1011133 A1 | 6/2000 | | |
| EP | 2 685 491 A2 | 1/2014 | | |
| JP | 04-337694 | 11/1992 | | |
| JP | 2000-100679 | 4/2000 | | |
| JP | 2001-102479 | 4/2001 | | |
| JP | 2001-284520 | 10/2001 | | |
| JP | 2002-353416 | 12/2002 | | |
| JP | 2002-359345 | 12/2002 | | |
| JP | 2004-193493 | 7/2004 | | |
| JP | 2008-130603 A | 6/2008 | | |
| JP | 2011-171614 | 9/2011 | | |
| JP | 2013-33786 | 2/2013 | | |
| JP | 2018-160519 | 10/2018 | | |
| KR | 10-2001-0104643 | 11/2001 | | |
| KR | 10-2010-0123755 | 11/2010 | | |
| KR | 10-2015-0097798 | 8/2015 | | |
| KR | 10-2020-0092236 | 8/2020 | | |
| WO | WO 2005/043584 A2 | 5/2005 | | |
| WO | WO 2006/100444 A1 | 9/2006 | | |
| WO | WO 2008/112101 A2 | 9/2008 | | |
| WO | WO 2010/024678 A1 | 3/2010 | | |
| WO | WO-2015183264 A1 * | 12/2015 | ............. | H01L 24/24 |
| WO | WO 2017/034654 A1 | 3/2017 | | |
| WO | WO 2017/052652 A1 | 3/2017 | | |
| WO | WO 2017/151442 A1 | 9/2017 | | |
| WO | WO 2023/181637 A1 | 9/2023 | | |

OTHER PUBLICATIONS

Office Action for U.S. Appl. No. 16/515,417, mailed on Aug. 14, 2020, Huang, "Dielets on Flexible and Stretchable Packaging for Microelectronics", 10 Pages.

Office Action for U.S. Appl. No. 16/515,417, mailed on Nov. 2, 2020, Huang, "Dielets on Flexible and Stretchable Packaging for Microelectronics", 10 pages.

Office Action for U.S. Appl. No. 16/515,417, mailed on Sep. 10, 2021, Huang, "Dielets on Flexible and Stretchable Packaging for Microelectronics", 8 pages.

Khan, et al., "Technologies for Printing Sensors and Electronics Over Large Flexible Substrates," IEEE Sensors Journal, vol. 15, No. 6, Jun. 2015, 22 pages.

Amirfeiz et al., "Formation of silicon structures by plasma-activated wafer bonding," Journal of the Electrochemical Society, 2000, vol. 147, No. 7, pp. 2693-2698.

Braunisch, H. et al., "High-speed performance of silicon bridge die-to-die interconnects," 2011 IEEE, pp. 95-98.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Frumusanu, Andrei, "TSMC's version of EMIB is 'LSI': Currently in pre-qualification," AnaandTech, https://www.anandtech.com/show/16031/tsmcs-version-of-emib-lsi-3dfabric, Aug. 25, 2020, 6 pages.

Fukushima, T. et al., "New three-dimensional integration technology using self-assembly technique," International Electron Devices Meeting Dec. 5-7, 2005, IEEE, Dec. 5, 2005, pp. 348-351.

Gösele et al., "Semiconductor Wafer Bonding: A flexible approach to materials combinations in microelectronics; micromechanics and optoelectronics," IEEE, 1997, pp. 23-32.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.

(56) References Cited

OTHER PUBLICATIONS

Howlader et al., "A novel method for bonding of ionic wafers," Electronics Components and Technology Conference, 2006, IEEE, p. 7-pp.
Howlader et al., "Bonding of p Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion mailed Apr. 22, 2019 in International Application No. PCT/US2018/064982, 13 pages.
International Search Report and Written Opinion mailed Oct. 25, 2019, issued in International Application No. PCT/US2019/040622, 12 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
NASA SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, 1 page.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding, IEMT/IMC Symposium, 1997, Joint International Electronic Manufacturing Symposium and the International Microelectronics Conference," Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.

(56) References Cited

OTHER PUBLICATIONS

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takagi et al., "Room-temperature wafer bonding of silicon and lithium niobate by means of arbon-beam surface activation," Integrated Ferroelectrics: An International Journal, 2002, vol. 50, Issue 1, pp. 53-59.

Takagi et al., "Surface activated bonding silicon wafers at room temperature," Appl. Phys. Lett. 68, 2222 (1996).

Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.

Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

Tong et al., "Low temperature wafer direct bonding, Journal of Microelectomechanical systems," Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Uhrmann, T. et al., "Heterogeneous integration by collective die-to-wafer bonding," Chip Scale Review, Nov./Dec. 2018, vol. 22, No. 6, pp. 10-12.

Urteaga, M. et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption|spectroscopy," Journal of Vacuum Science & Technology B, Jul./Aug. 1996, vol. 14, No. 4, pp. 3095-3106.

Xu et al., "New Au—Al interconnect technology and its reliability by surface activated bonding," Electronic Packaging Technology Proceedings, Oct. 28-30, 2003, Shanghai, China, pp. 479-483.

Ceramic Microstructures: Control at the Atomic Level, Recent Progress in Surface Activated Bonding, 1998, pp. 385-389.

Bush, Steve, "Electronica: Automotive power modules from On Semi," ElectronicsWeekly.com, indicating an OnSemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Hasi, J. et al., "Advanced Interconnects for Particle Physics and Beyond," SLAC National Accelerator Laboratory, Ronald Lipton, 3D Integration of Sensors and Electronics, Oct. 13, 2017, 25 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

OnSemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "OnSemi AR0820."

Ross, John, "Rigid-flex PCB design: Benefits and design best practices," Technical Article, Sep. 24, 2018, 7 pages.

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."

Urteaga, M. et al., "CMP process development on III-V substrates for 3D heterogeneous integration," Teledyne Scientific & Imaging, Thousand Oaks, CA, 3 pages.

"Curing Agents for Epoxy Resin," Three Bond Technical News, Dec. 20, 1990, 10 pages.

Fowler, Michelle et al., "A Novel Photosensitive Permanent Bonding Material Designed for Polymer/Metal Hybrid Bonding Applications," CS Mantech Conference, May 9-12, 2022, pp. 211-215.

"Silane Coupling Agents," Shin-Etsu Chemical Co., Ltd., Jun. 2017, 28 pages.

Zhao, O. et al., "Insights into the Mechanical Properties of Ultrathin Perfluoropolyether-Silane Coatings," Langmuir 2022, vol. 38, No. 20, pp. 6435-6442, DOI: 10.1021/acs.langmuir.2c00625.

Aixtron, "3D integration unites InP, GaN and silicon CMOS." Compound Semiconductor. Jan.-Feb. 2018;24(1): 7 pages; downloaded from URL: https://compoundsemiconductor.net/article/104207/3D_Integration_Unites_InP_GaN_And_Silicon_CMOS on Sep. 10, 2024.

Carter et al., "Wafer-Scale InP/Si CMOS 3d Integration Using Low-Temperature Oxide Bonding". In Compound Semiconductor Week (CSW, Santa Barbara, CA, (2015)), pp. 493-494.

Carter Andrew, "3D Heterogenous Integration of CMOS, InP, and GaN Devices Using Hybrid Wafer Bonding". In 2016 3DASIP Conference Dec. 14, 2016; 25 Pages.

Carter et al., Q-Band InP/CMOS Receiver and Transmitter Beamformer Channels Fabricated by 3D Heterogeneous Integration. In 2017 IEEE MTT-S Intern Microwave Symposium (IMS) Jun. 4, 2017 (pp. 1760-1763).

Carter et al., "Si/InP Heterogeneous Integration Techniques from the Wafer-Scale (Hybrid Wafer Bonding) to the Discrete Transistor (Micro-Transfer Printing)," 2018 IEEE SOI-3D-Subthreshold Microelectronics Technology Unified Conference (S3S), Burlingame, CA, USA, 2018, pp. 1-4, doi: 10.1109/S3S.2018.8640196.

Dunsworth et al., "A method for building low loss multi-layer wiring for superconducting microwave devices". Applied Physics Letts. Feb. 5, 2018;112(6) 10 pages.

Eibelhuber et al., "Advanced bonding techniques for photonic integrated circuits." In CS Mantech Conference May 19, 2014, Denver, CO—USA; pp. 331-334.

Huang et al., "Wafer-Level Polymer/Metal Hybrid Bonding Using a Photosensitive Permanent Bonding Material". Chip Scale Review. Mar.-Apr. 2022;26(2): 49-53.

Jin et al. Fabrication of AI air-bridge on coplanar waveguide. 2018 Chinese Phys. B 27 100310; 3 pages; DOI: 10.1088/1674-1056/27/10/100310.

Urteaga et al., "CMP Process Development on III-V Substrates for 3D Heterogeneous Integration." CS ManTech. May 1, 2019, 5 pages; downloaded from URL: https://csmantech.org/paper/8-4-cmp-process-development-on-iii-v-substrates-for-3d-heterogeneous-integration/.

Elsherbine et al., "Hybrid bonding interconnect for advanced heterogeneously integrated processors." In 2021 IEEE 71st Electronic Components and Technology Conference (ECTC) Jun. 1, 2021 (pp. 1014-1019).

Chen et al., "Optical properties of amorphous $Ta_2O_5$ thin films deposited by RF magnetron sputtering," Optical Materials. Nov. 1, 2019;97:109404; 7 pages.

Cheng et al., "Grating couplers on silicon photonics: Design principles, emerging trends and practical issues," Micromachines 2020, 11, 666. Micromachines. Apr. 13, 2022;13(4):606; 25 pages.

(56) References Cited

OTHER PUBLICATIONS

Jedrzejowski et al., "Mechanical and optical properties of hard SiCN coatings prepared by PECVD," Thin Solid Films. Jan. 30, 2004;447:201-207.

Li et al., "Process development of low-loss LPCVD silicon nitride waveguides on 8-inch wafer," Applied Sciences. Mar. 13, 2023;13(6):3660; 12 pages.

Matsumura et al., "Fabrication of Copper Damascene Patterns on Polymide Using Direct Metallization on Trench Templates Generated by Imprint Lithography," Langmuir 2010, 26(14), 12448-12454.

Permana, David "Chemical Mechanical Planarization of Copper/Polyimide Mamascene Structure with Glycerol-Based Slurry," Rensselaer Polytechnic Institute Troy, New York, Aug. 1999.

Price, et al., "Damascene coppper interconnects with polymer ILDs," Thin Solid Films 308-309 (1997) 523-528.

Suzuki et al., "Cu/Polyimide Multilayer Interconnections Fabricated by Nanoimprint at Every Lithography Process," Journal of Photopolymer Science and Technology, vol. 27, No. 1 (2014) 73-80.

You et al., Widely tunable refractive index silicon nitride films deposited by ion-assisted pulsed DC reactive magnetron sputtering. Optical Materials. Feb. 1, 2023;136:113354; 8 pages.

* cited by examiner

SIDE VIEW

300

TOP VIEW

SIDE VIEWS

SIDE VIEW

FRONT VIEW

SIDE VIEW

FRONT VIEW

EXAMPLE ACTUAL SIZES

DIELETS ON FLEXIBLE AND STRETCHABLE PACKAGING FOR MICROELECTRONICS

RELATED APPLICATIONS

This application is a continuation of and claims priority to U.S. patent application Ser. No. 16/515,417, filed Jul. 18, 2019, which is a continuation of and claims priority to U.S. patent application Ser. No. 15/970,055, filed May 3, 2018, now U.S. Pat. No. 10,403,577, issued Sep. 3, 2019, which are incorporated herein by reference in their entirety.

BACKGROUND

Flexible and stretchable electronics packages provide computing power in certain environments where flexibility and good shock-resistance is needed. Various sports applications, medical devices, nano-sensors, micro-electromechanical systems, and networking modules for the Internet-of-Things can benefit from microelectronics on flexible substrates. For example, wrist wraparound devices can be made thinner, lighter, and less noticeable when the onboard microelectronics can flex with the changing environment. Shape-compliant and shock-resistant microelectronics can be included in many items, such as vibrating appliances, motor parts, clothing, wearable fitness sensors, bandages, flexible medical devices, heart catheters, bottles, drinking cans, footballs, balloons, and so forth, that are traditionally off-limits to conventional electronics on rigid substrates.

Dielets and small chiplets work well with flexible substrates to bring the processing power of large microprocessors characteristic of CPUs to flexible microelectronics packages. An array of dielets enables a microprocessor to be "broken-up" into subsystems, located on many individual dielet pieces flexibly connected together, each dielet performing a function or containing a subsystem of the conventionally monolithic microprocessor. Each dielet may have a specific or proprietary function from a library of functions, enabling a collection of dielets to emulate the large monolithic chip. A dielet or chiplet can be a complete subsystem IP core (intellectual property core) possessing a reusable unit of logic, on a single die. A library of such dielets is available to provide routine or well-established IP-block functions. The numerous dielets for emulating many functions of a large monolithic processor can also be made very thin, making a processor or CPU that is distributed in dielets to be more physically compliant, thinner, lighter weight, and more shock-resistant than conventional devices.

Computer memory, on the other hand, such as random access memory (RAM), cannot be made too thin without degrading memory performance in proportion. At physical slices thinner than 50 microns, a loss-of-memory disadvantage begins to outweigh the thinness advantage. Thus, it can be difficult to achieve large amounts of memory on thin, compliant microelectronics packages, because the memory chips need to remain relatively thick.

Nonetheless, both significant computer memory and microprocessing elements could theoretically be implemented on thin, flexible substrates as distributed collections of dielets if the interconnections between the dielets could be made dense enough to provide high-capacity communication between the dielets. But the dielets are small, and so high-density communication between dielets has conventionally proven to be a challenge.

SUMMARY

Dielets on flexible and stretchable packaging for microelectronics are provided. An example process uses high-density interconnects direct-bonded or hybrid between standard interfaces of dielets to create a flexible microelectronics package. In another example, a process uses high-density interconnections direct-bonded or hybrid bonded between native interconnects of the dielets to create the flexible microelectronics packages, without the standard interfaces. A native interconnect of a dielet is defined herein as a core-side conductor of the dielet that conducts core-side signals of the dielet before the signal is modified by a standard interface of the dielet. Some dielets may not have a standard interface, so a native interconnect is the only way for such a dielet to port the native core-side signals.

High-density communication between the dielets is achieved with various direct-bonding techniques that achieve high conductor count and very fine pitch on flexible, stretchable, and/or twistable substrates. An example process uses high-density interconnects direct-bonded between standard interfaces of dielets to create a flexible microelectronics package. In another example, a process uses high-density interconnections direct-bonded between native interconnects of the dielets to create the flexible microelectronics packages, without the standard interfaces.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes dielets on flexible and stretchable packaging for microelectronics. Significant computing power is achieved on small flexible packages by implementing a collection of distributed dielets, interconnected by direct-bonding interconnect (DBI®) techniques with a relatively high count of fine-pitched conductive lines on the flexible or stretchable substrates. The high-density interconnections may be between standard input-output (I/O) interfaces of the dielets being interconnected, or in some cases may be between native core-level interconnects of the dielets being interconnected.

In an implementation, the high count of fine-pitched conductive lines between dielets is achieved by direct-bonding or hybrid bonding processes (both processes encompassed representatively herein by the term "direct-bonding"), which are able to connect dielets to lines or wires at a very fine pitch. For example, the hybrid bonding process may be a DBI® hybrid bonding technique, available from Invensas Bonding Technologies, Inc. (formerly Ziptronix, Inc.), a subsidiary of Xperi Corp. In an implementation, DBI® hybrid bonding of conductive lines between standard input-output (I/O) interfaces of the dielets is used to achieve high-density inter-dielet communications, while in another implementation, DBI® hybrid bonding of conductive lines between native interconnects of the dielets is used to achieve the high-density inter-dielet communications in the context of flexible packaging. The signal pitch within a given dielet may be in the 0.1-5.0 micron pitch range. Native conductors of a given dielet may be at an average pitch of approximately 3 microns in the dense areas, so the direct-bonding technology, such as DBI® hybrid bonding, is able to connect conductors together at these fine and ultrafine pitches. The dielets can be very small, however, with footprint dimensions of 0.25×0.25 microns and on up. So native conductors of the dielets are proportionately fine-pitched.

Figure 1:
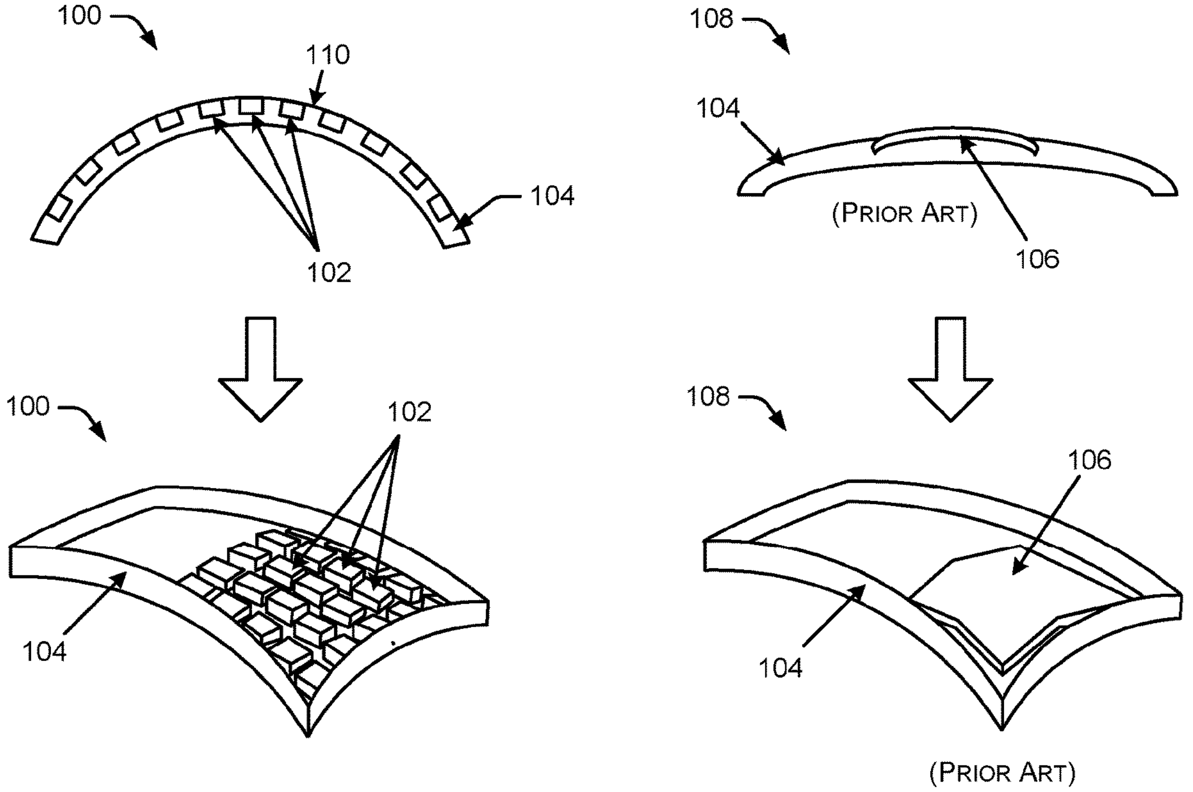
FIG. 1 is a diagram of an example microelectronics package in which many relatively small dielets are attached to a flexible substrate for a low stress package.

FIG. 1 shows a microelectronics package 100 in which many relatively small dielets 102 are attached to a flexible substrate 104, such as a flexible organic substrate, for a low stress package that has flexibility and shock-resistance. The dielets 102 may be attached to the flexible substrate 104 in a wafer-level reconstitution process, for example.

In contrast, attachment of conventional large dies 106 to a flexible substrate 104, even when the conventional large dies 106 are thinned, results in a higher-stress package 108 that has limited flexibility.

In an implementation, the dielets 102 in a flexible microelectronics package 100 may be small, single crystalline dielets 102 embedded in, or mounted on, the flexible substrate 104 and arrayed in a fan-out-wafer-level package (FOWLP), for example, for high integration with a relatively high number of external contacts. The FOWLP layout can yield a small package footprint with high input/output (I/O) capacity and improved thermal performance because the dielets 102 shed heat more efficiently than large chips, and can yield improved electrical performance depending on the fan-out design. In an implementation, high-density interconnections 110 between the dielets 102 are implemented by a direct hybrid bonding process to achieve a sufficient number of lines along the limited beachfront of each dielet 102 to achieve significant computing power among the array of dielets 102 on the flexible substrate 104.

Figure 2:
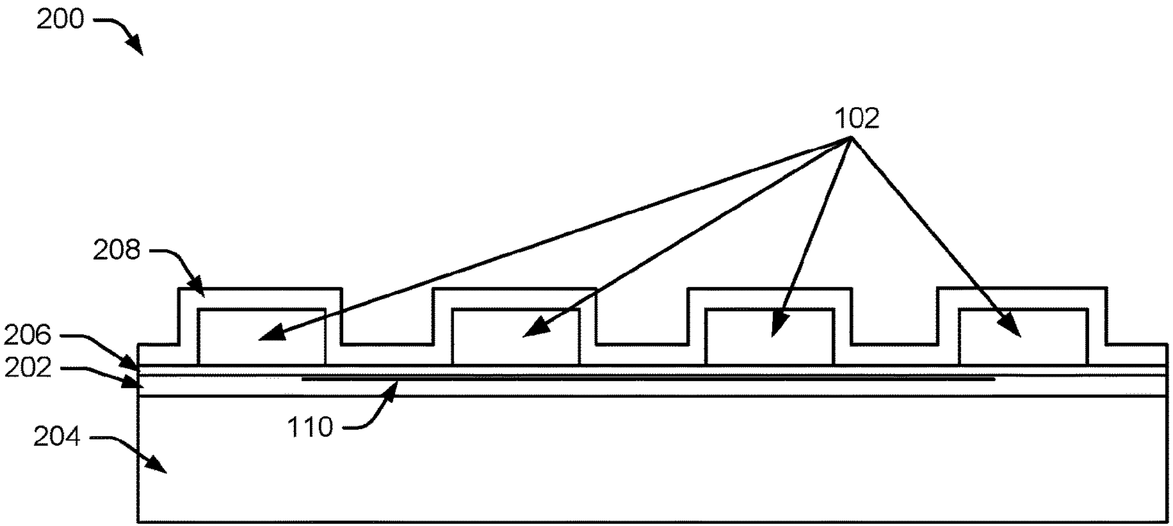
FIG. 2 is a diagram of an example microelectronics package fabricated in an example reconstitution process.
Figure 2:
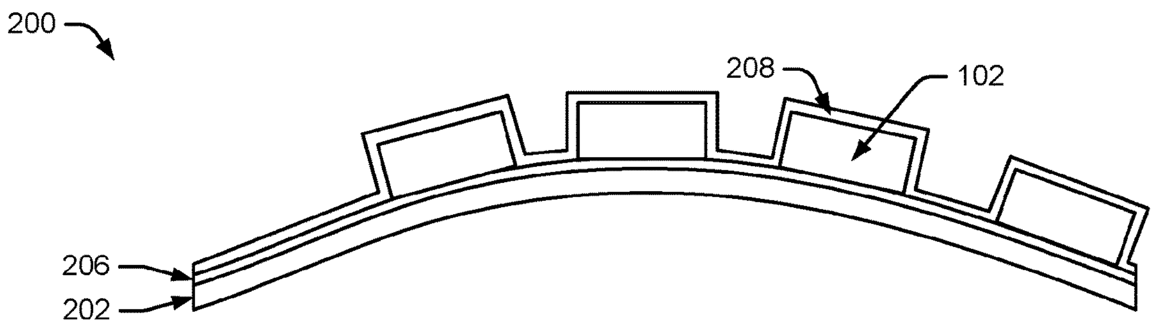

FIG. 2 shows an example microelectronics package 200 fabricated in an example reconstitution process. A flexible routing layer 202 with high-density interconnects 110 is applied to, or built upon, a carrier 204, such as a pad or wafer of silicon or glass, or onto a substrate made of another material. An optional oxide layer 206 (layers not shown to relative scale) may be added onto the flexible routing layer 202 when the direct-bonding process forms oxide bonds, such as oxide-oxide bonds, or metal-oxide bonds. The dielets 102 are attached to the flexible routing layer 202 including, for example, the step of direct-bonding conductive I/O contact pads of the dielets 102 to high-density conductive lines 110 in the flexible routing layer 202. An optional conformal coating 208 may be applied over and between the dielets 102. The carrier 204 is then removed, leaving the dielets 102 electrically interconnected and attached to the flexible routing layer 202. If the flexible routing layer 202 is durable enough for the given microelectronics application, then the conformal coating 208 on top of the dielets 102 may be omitted.

Figure 3:
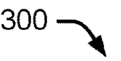
FIG. 3 is a diagram of another example microelectronics package fabricated in another example reconstitution process.
Figure 3:
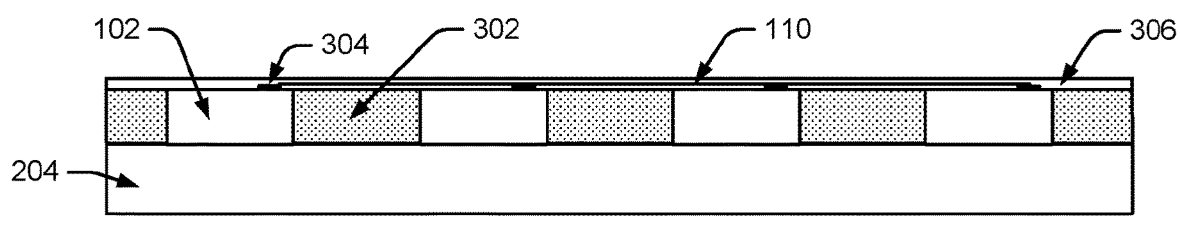
Figure 3:
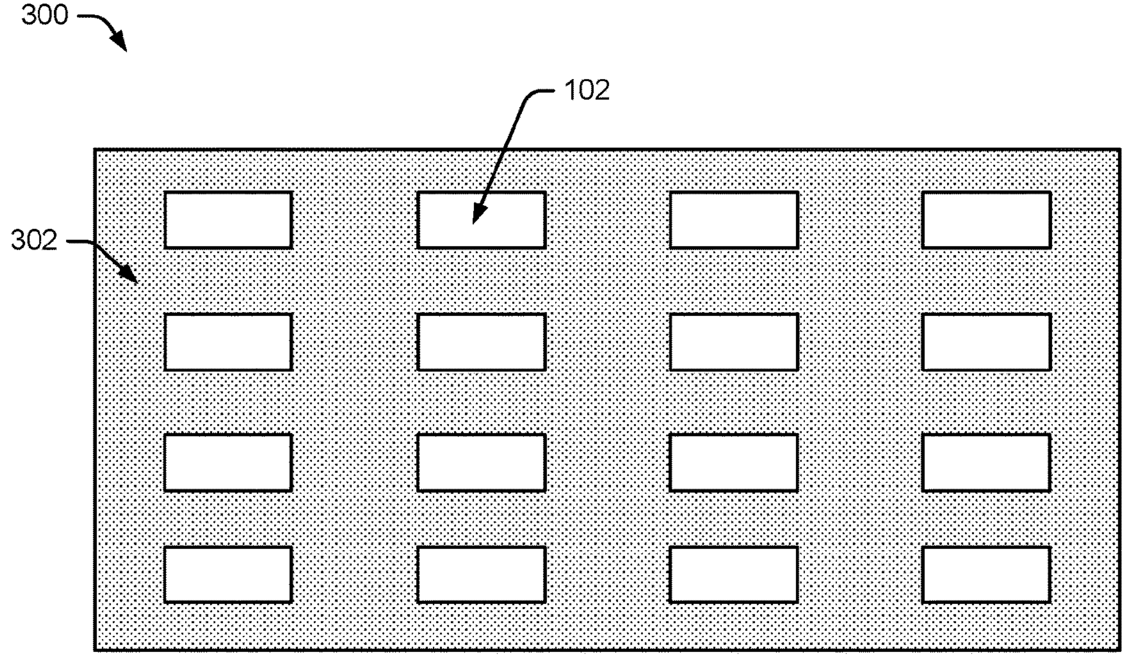

FIG. 3 shows another example microelectronics package 300 fabricated in another example reconstitution process. The dielets 102 are mounted face-up on a carrier 204, covered and interspersed with a molding material 302, and planarized to expose conductive contacts 304. Then a redistribution layer (RDL) 306 or thin-film process creates inter-dielet interconnects 110, applying a direct-bonding process. For example, in an implementation, the dielets 102 can be front-end prefabricated, and attached face-up to the pad or artificial wafer 204. After attachment of the dielets 102, a molding process may inject a molding compound 302 at least around the dielets 102 to form a compound die-carrier, which becomes an artificial reconstituted wafer. Gaps and edges around the dielets 102 are filled with the casting compound 302 to form the artificial wafer. After curing through thermal processing, the artificial wafer includes a mold frame 302 around the dies for carrying the additional interconnect elements 110. After the build, the electrical connections from the dielet pads 304 to interconnects 110 can be made in thin-film technology, for example, as they are for other conventional Wafer Level Packages (WLPs). The flexible microelectronics packages 100 & 200 & 300 may also be fabricated in many other ways besides example reconstitution processes.

Metal-metal direct-bonding of conductive lines to the dielets 102 may be accomplished with fine pitch interconnection techniques, such as direct bond interconnect (DBI®), a hybrid technology that directly bonds conductive metal bond pads on each side of an interface together, and also bonds respective dielectrics together on each side of the interface. The direct bonding or direct hybrid bonding processes can electrically connect the dielets 102 together via the conductive lines, even when the dielets 102 have different process node parameters (Ziptronix, Inc., an Xperi Corporation company, San Jose, CA). DBI® hybrid bonding is currently available for fine-pitch bonding in 3D and 2.5D integrated circuit assemblies to bond the dielets 102 to interconnect lines 110 between the dielets 102. See for example, U.S. Pat. No. 7,485,968, which is incorporated by reference herein in its entirety.

DBI® hybrid bonding technology, for example, has been demonstrated at an interconnect pitch of 2 um. DBI® bonding technology has also been demonstrated down to a 1.6 um pitch in wafer-to-wafer approaches that do not have an individual die pitch limitation, with pick-and-place (P&P) operations (Pick & Place surface-mount technology machines). Using DBI® technology, a DBI® metallization layer replaces under bump metallization (UBM), underfill, and micro-bumps. Bonding at dielet level is initiated at room temperature and may be followed by a batch anneal at low temperature. ZiBond® direct bonding may concomitantly be used in some circumstances (Ziptronix, Inc., an Xperi Corporation company, San Jose, CA).

The flexible routing layer 202 may be created in numerous ways. Although other materials can be employed for the flexible and stretchable microelectronics described herein, with high-density interconnections between dielets 102, plastic materials are a preferred substrate due to their low cost and the inherent high degree of flexibility, bendability, and stretchability of select plastics. Plastic materials also provide some attractive chemical and mechanical properties. Clear plastics can be used for optical applications where transparency is an advantage or requirement.

Flexible electronics on plastic substrates may lower the cost of production, using roll-to-roll (R2R) and other manufacturing processes, for example. Polymers that can be used as flexible substrates or flexible routing layers 202 include polyethylene terephthalate (PET), heat stabilized PET, polyetheretherketone (PEEK), polyethylene napthalate (PEN), and heat stabilized PEN, for example. Other polymer substrates include polycarbonate (PC) and polyethersulphone (PES), which are thermoplastics that can be melt-extruded or solvent-casted. Some polymers that cannot be melt-processed include modified polycarbonate (PC), polyarylate (PAR), polyethersulphone (PES), polycyclic olefin (PCO), polynorbonene (PNB), and polyimide (PI).

Polymer substrates with glass transition temperatures higher than 140° C. (for example, heat stabilized PEN and PET) have high melting points, which allows these polymers to be melt processed without degradation. Most polymers can be made transparent, for optical clarity.

The coefficient of thermal expansion (CTE) of a flexible substrate or flexible routing layer 202 is an important issued in making example flexible microelectronic devices. When there is a difference in CTEs between the flexible substrate and layers built or deposited on the flexible substrate, the built or deposited layers may strain and crack under thermal cycling. A flexible material with a low CTE (for example, less than 20 ppm/° C.) is desirable to match the thermal expansion of the substrate to the subsequent layers which may be deposited on top of the flexible layer.

Figure 4:
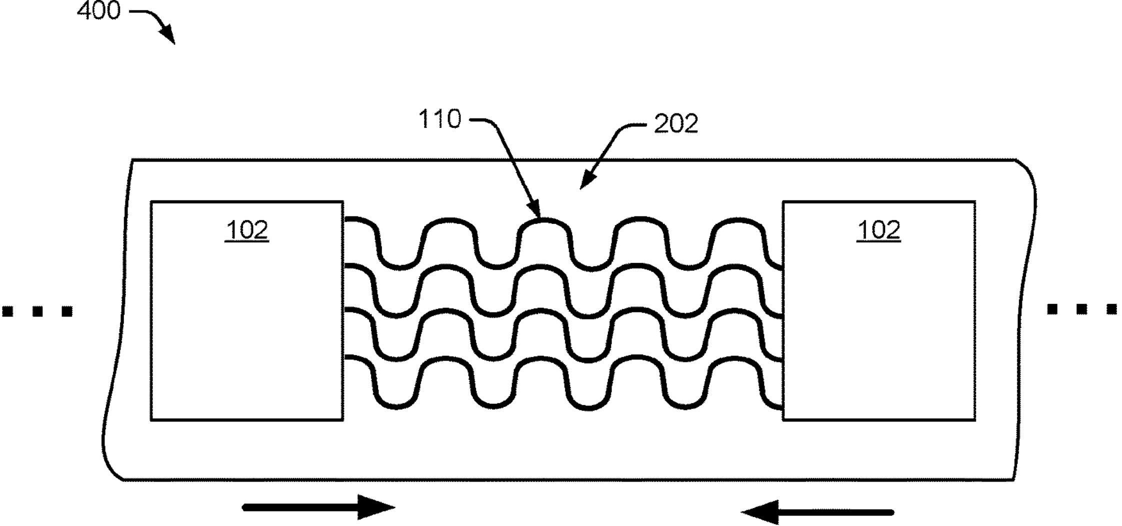
FIG. 4 is a diagram of a section of an example microelectronics device in which dielets are attached to a flexible, stretchable, and/or twistable routing layer that includes compliant high-density interconnect lines.
Figure 4:
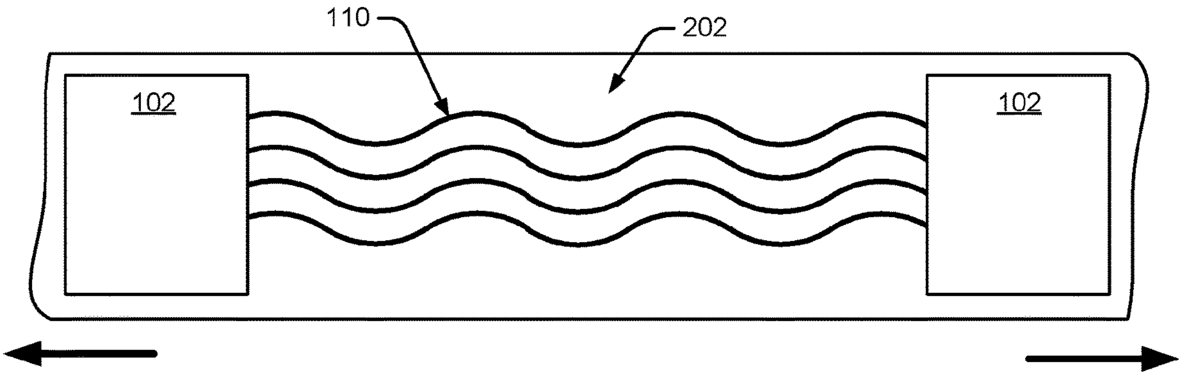

FIG. 4 shows a section of an example microelectronics device 400 in which dielets 102 are attached to a flexible, stretchable, and/or twistable routing layer 202 that includes compliant high-density interconnect lines 110. When the flexible substrate material of the flexible routing layer 202 is bent, flexed, stretched, or twisted, the material and/or geometry of the high-density interconnect lines 110 enables the interconnect lines 110 to bend, flex, stretch, or twist with the flexible substrate material.

Figure 5:
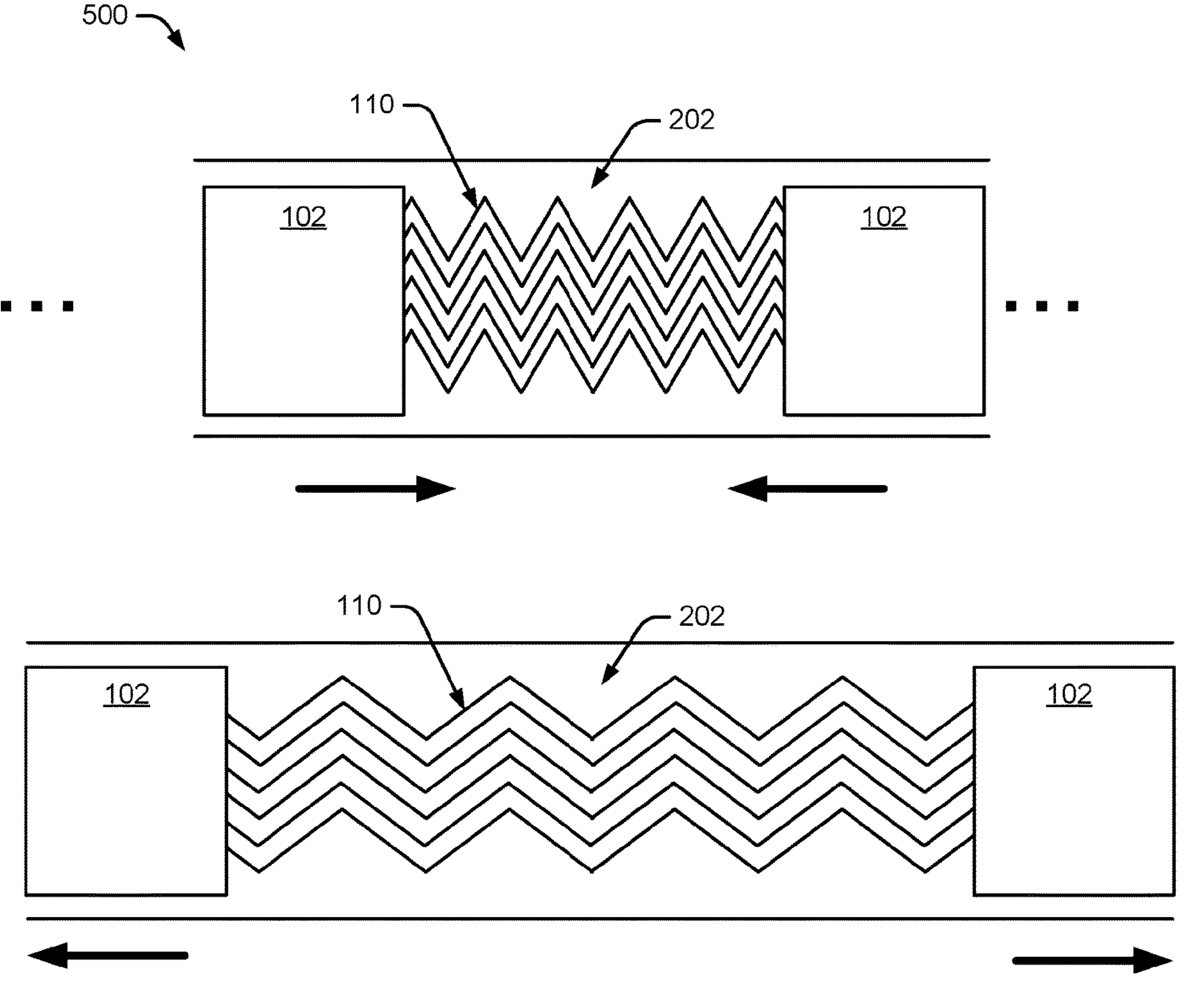
FIG. 5 is a diagram of another example microelectronics device in which dielets are attached to a flexible, stretchable, and/or twistable routing layer that includes a different configuration of compliant high-density interconnect lines than shown in FIG. 4.

FIG. 5 shows a section of another example microelectronics device 500 in which dielets 102 are attached to a flexible, stretchable, and/or twistable routing layer 202 that includes a different configuration of compliant high-density interconnect lines 110 than shown in FIG. 4. When the flexible substrate material of the flexible routing layer 202 is bent, flexed, stretched, or twisted, the material and/or geometry of the high-density interconnect lines 110 enables the interconnect lines 110 to bend, flex, stretch, or twist with the flexible substrate material.

Figure 6:
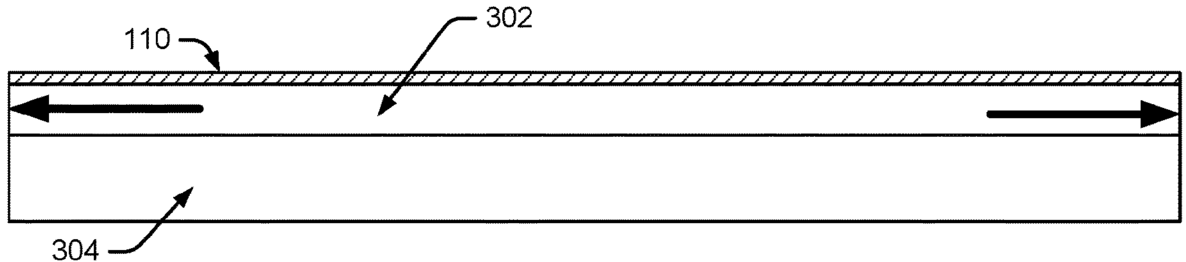
FIG. 6 is a diagram of an example manufacturing process for making a flexible and stretchable microelectronics package.
Figure 6:
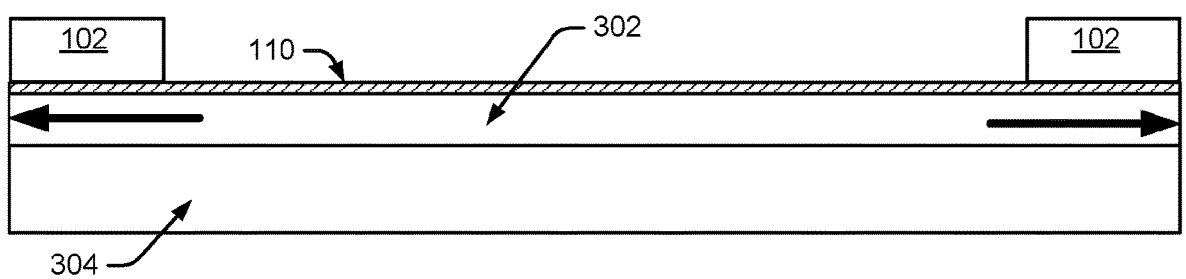
Figure 6:
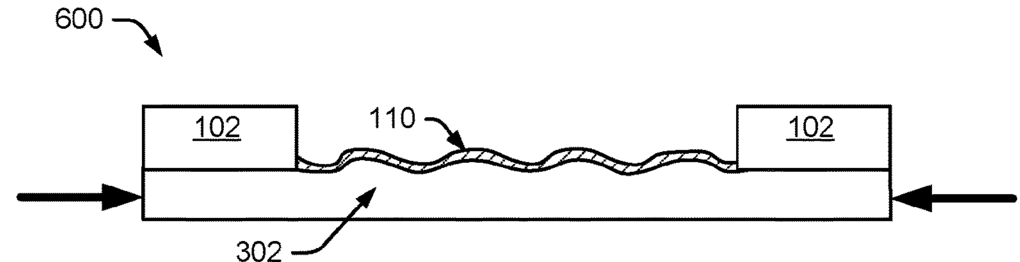

FIG. 6 shows an example manufacturing process for making a flexible and stretchable microelectronics package 600. A flexible substrate 302 is stretched over a hard surface, such as a wafer, platform, or mandrel 204. Conductive interconnect lines 110 at fine pitch are deposited, printed, or formed on the stretched surface of the stretched flexible substrate 302. Next, dielets 102 are attached to the flexible substrate 302, and electrically connected to the conductive interconnect lines 110 through a direct bonding or hybrid bonding technique, such as DBI® hybrid bonding. The flexible substrate 302 with conductive interconnect lines 110 is removed from the wafer, platform, or mandrel 204 and allowed to relax, relieving the stretch in while contracting. The conductive interconnect lines 110 fold or otherwise find a geometry to compact themselves when the flexible substrate 302 contracts. The flexible and stretchable microelectronics package 600 can be flexed and stretched in the future, to at least the point of stretch present in the flexible substrate 302 during manufacture.

Figure 7:
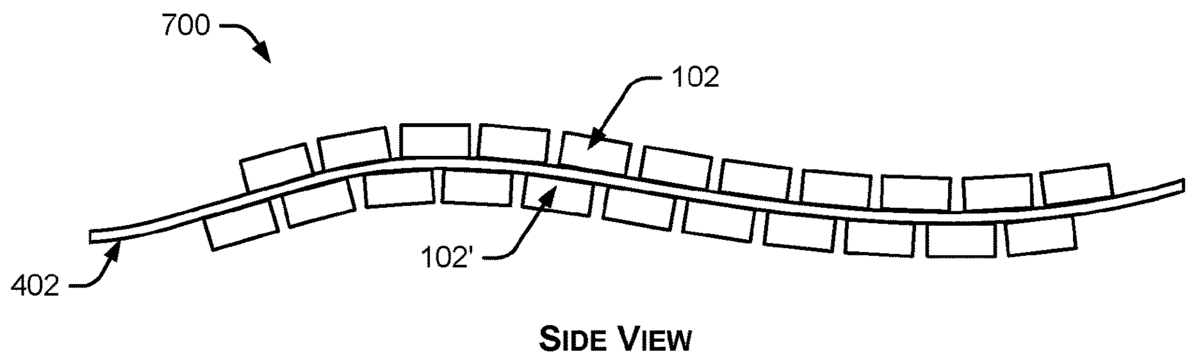
FIG. 7 is a diagram of an example flexible microelectronic band or strip with dielets attached on both sides of a flexible substrate or membrane.
Figure 7:
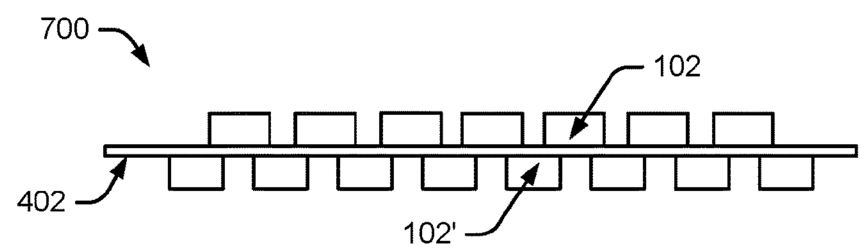

FIG. 7 shows an example flexible microelectronic band or strip 700 with dielets 102 attached on both sides of a flexible substrate 302 or membrane. The band or strip 700 may be used for wearable electronics, or may be used as a module or "card" in vibration-prone or shock-prone environments.

The dielets 102 may be in communication with each other on each side, and may be in communication with each other across the flexible substrate 302 or membrane, through conductive vias across the flexible substrate 302 or membrane. The flexible substrate 302 or membrane may be relatively thick, or may be extremely thin, depending on the polymer or other material used, for example down to 2 microns thick. The dielets 102 may also be relatively small, down to 2 microns on an edge. The dielets 102 may communicate with each other via standard I/O interfaces on some or all of the dielets 102. Some dielets 102 may communicate with other dielets 102' across the flexible substrate 302 or membrane via their core-side conductors, direct-bonded or hybrid bonded directly to the core-side conductors of the dielets 102' across the flexible substrate 302 or membrane, with no intervening standard I/O interfaces on the dielets 102 & 102'.

When the example flexible microelectronic device 700 uses dielets 102 that have core-side conductors direct-bonded to one or more other dielets 102', thereby providing "native interconnects," the native interconnects can be the only interface between the connected dielets 102 & 102'. The native interconnects can enable electronic circuits to span across many different dielets 102 & 102' and across the dielet boundaries without the overhead of standard interfaces, including no input/output protocols at the cross-die boundaries traversed by the direct-bonded connections to the native core-side conductors of the dielets 102 & 102'.

Standard interfaces mean "additional hardware, software, routing, logic, connections, or surface area added to the core logic real estate or functionality of a dielet 102 or 102' in order to meet an industry or consortium specifications for interfacing, connecting, or communicating with other components or signals outside the dielet 102.

The direct-bonding, such as DBI® hybrid bonding, that enables native interconnects to be used at very fine pitch between dielets 102 & 102', means direct-contact metal-to-metal bonding, oxide bonding, or fusion bonding between two metals, such as copper to copper (Cu—Cu) metallic bonding between two copper conductors in direct contact, with at least partial copper metallic crystal lattice cohesion. Such direct-bonding may be provided by room-temperature DBI® (direct bond interconnect) hybrid bonding technology or other direct bonding techniques (Ziptronix, Inc., an Xperi Corporation company, San Jose, CA). "Core" and "core-side" mean at the location, signal, and/or level present at the functional logic of a particular dielet 102, as opposed to at the location, signal, and/or level of an added standard interface defined by a consortium. Thus, a signal is raw or "native" if it is operational at the core functional logic level of a particular die, without certain modifications, such as additional serialization, added ESD protection except as inherently provided by the particular circuit; has an unserialized data path, can be coupled across dies by a simple latch, flop, or wire, has no imposed input/output (I/O) protocols, and so forth. A native signal, however, can undergo level shifting, or voltage regulation for purposes of adaptation between dies of heterogeneous foundry origin, and still be a native signal, as used herein. Thus, a native conductor of a dielet 102 or 102' is an electrical conductor that has electrical access to the raw or native signal of the dielet 102, as described above, the native signal being a signal that is operational at the level of the core functional logic of a particular die, without appreciable modification of the signal for purposes of interfacing with other dielets 102 or 102'.

The native interconnects for conducting such native signals from the core-side of a dielet 102 can provide continuous circuits disposed through two or more cross-die boundaries and through the flexible substrate 402 of the particular flexible microelectronic device 700 without amplifying or modifying the native signals, except as desired to accommodate dielets 102 from different manufacturing processes. From a signal standpoint, the native signal of the IP core of one dielet 102 is passed directly to other dielets 102' via the directly bonded native interconnects, with no modification of the native signal or negligible modification of the native signal, thereby forgoing standard interfacing and consortium-imposed input/output protocols.

Such uninterrupted circuits that proceed across dielet boundaries with no interfacing and no input/output protocols can be accomplished using native interconnects fabricated between different dielets 102 from heterogeneous foundry nodes or dielets 102 with incompatible manufacturing. Hence, an example circuit may proceed across the dielet boundary between a first dielet 102 manufactured at a first foundry node that is direct-bonded to a second dielet 102' manufactured at a second foundry node, with no other interfacing, or with as little as merely latching or level shifting, for example, to equalize voltages between dielets 102 & 102'. In an implementation, the circuits disposed between multiple dies through direct-bonded native interconnects may proceed between custom dielets 102 on each side of a wafer-to-wafer (W2W) process that creates direct-bonds, wherein at least some of the W2W direct bonding involves the native conductors of dielets 102 on at least one side of the W2W bonds.

In an implementation, a flexible microelectronic device 700 utilizing semiconductor dielets 102 can reproduce various architectures, such as ASIC, ASSP, and FPGA, in a smaller, faster, and more power-efficient manner, as each dielet 102, as introduced above, is a complete subsystem IP core (intellectual property core), for example, a reusable unit of logic on a single chiplet or die piece.

Figure 8:
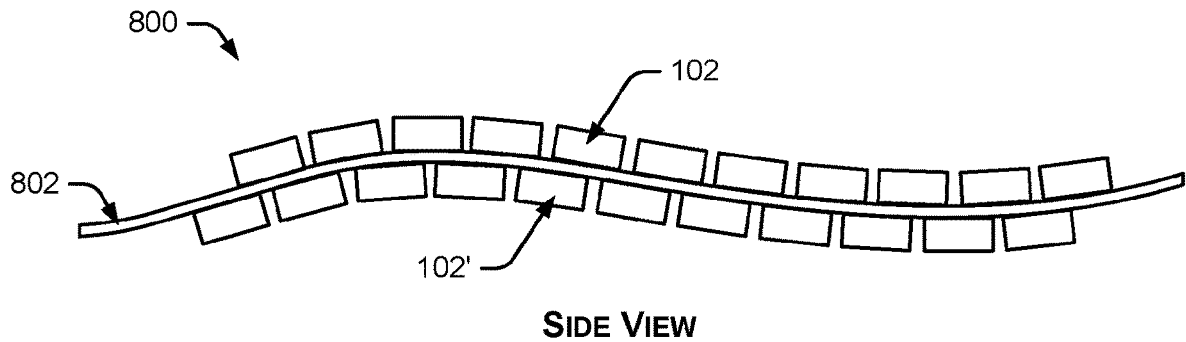
FIG. 8 is a diagram of an example flexible and/or stretchable microelectronic string or filament device with dielets attached on both sides of a flexible and/or stretchable filament substrate.
Figure 8:
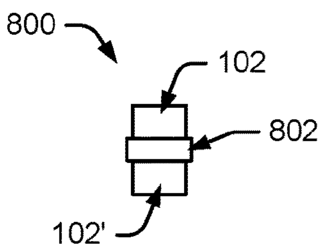
Figure 8:
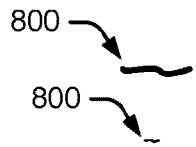

FIG. 8 shows an example flexible and/or stretchable microelectronic string or filament device 800 with dielets 102 attached on both sides of a flexible and/or stretchable filament substrate 802. The flexible filament device 800 may have dielets 102 attached across a very narrow width 804, for example a few microns across, with very small dielets 102 of the order of only microns on an edge. The flexible filament device 800 may have the dielets 102 attached in single file, as shown, on one or both sides of the flexible filament substrate 802. Such a flexible filament device 800 can be used to bring relatively complex microelectronics or high computing power to small sensors, wearable appliances, artificial hair, braces, implantable medical devices, catheters for dwelling inside blood vessels or other parts of a human or animal body, and so forth. The dielets 102 on a single side of the flexible filament device 800 may be communicatively coupled with each other via a high count of conductive lines direct-bonded to bonding pads of the dielets 102 for high-density communication between dielets 102. Dielets 102 & 102' on opposing sides of the flexible filament substrate 802 may be coupled with each other across the material of the flexible filament substrate 802 by direct-bonding or direct hybrid bonding between standard I/O interfaces of the dielets 102 & 102', or by direct-bonding or direct hybrid bonding between core-level native interconnects of the dielets 102 & 102', as described above.

Example Methods

Figure 9:
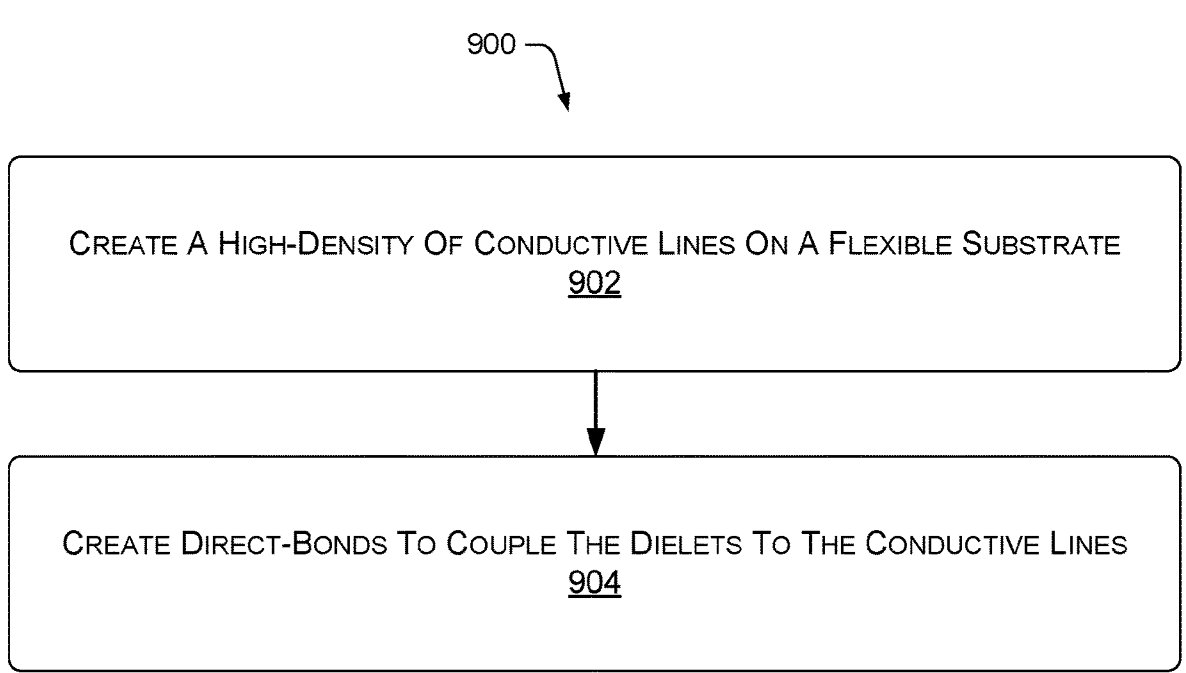
FIG. 9 is a flow diagram of an example method of making a flexible microelectronics package with direct-bonding techniques applied to dielets.

FIG. 9 shows an example method 900 of making a flexible microelectronic device with dielets that are direct-bonded to high-density interconnects. Operations of the example method 900 are shown in individual blocks.

At block 902, high-density conductive lines are created on a flexible substrate.

At block 904, direct-bonds are created to couple dielets to the high-density conductive lines. The dielets interconnected by high-density conductive lines can emulate the computing power of large monolithic chips with ample memory on a flexible, stretchable, or twistable substrates.

The flexible substrate may be made of polyethylene terephthalate (PET), heat stabilized PET, polyetheretherketone (PEEK), polyethylene napthalate (PEN), heat stabilized PEN, polycarbonate (PC), polyethersulphone (PES), polyarylate (PAR), polycyclic olefin (PCO), polynorbonene (PNB), or polyimide (PI), for example.

The method 900 may include coupling the dielets to the conductive lines at a pitch of approximately 3 microns. In some cases, the dielets may have footprint dimensions in a range of approximately 0.25×0.25 microns to approximately 5.0×5.0 microns, in which case the conductive lines and the direct-bonds are at a pitch of less than 3 microns, in relation to the size of the dielets used.

The method 900 may include coupling the dielets to the conductive lines through standard I/O interfaces onboard the dielets. Or, the method 900 may include coupling the dielets to the conductive lines through native core-level interconnects of the dielets at a pitch of 3 microns or less. In some cases the native interconnects may connect dielets through a thickness of the flexible substrate, and the dielets may be on both sides of the flexible substrate.

The method 900 may include extending a circuit of a first dielet across a die boundary between the first dielet and a second dielet via the native core-level interconnects between the first dielet and the second dielet, the circuit spanning across the native core-level interconnects, and passing the a native signal between a core of the first dielet and at least a functional block of the second dielet via the native core-level interconnects through the circuit spanning across the native core-level interconnects.

When native interconnects of the dielets are used instead of standard I/O interfaces of dielets, then a native core-side conductor of a first dielet may be direct-bonded to a core-level conductor of a second dielet to make a native interconnect between the first die and the second die. A circuit of the first dielet is extended via the native interconnect across a die boundary between the first dielet and the second dielet, spanning the native interconnect. A native signal of an IP core of the first dielet is passed between the core of the first dielet and at least a functional block of the second dielet through the circuit spanning across the native interconnect.

The native interconnects provided by the example method 900 may provide the only interface between a first dielet and a second dielet, while the native interconnects forgo standard interface geometries and input/output protocols. In an implementation, the first dielet may be fabricated by a first manufacturing process node and the second dielet is fabricated by a different second manufacturing process node. The circuit spanning across the native interconnect forgoes interface protocols and input/output protocols between the first dielet and the second dielet when passing the native signal across the native interconnect.

The example method 900 may further include direct-bonding native core-side conductors of multiple dielets across multiple dielet boundaries of the multiple dielets to make multiple native interconnects, and spanning the circuit across the multiple dielet boundaries through the multiple native interconnects. The multiple native interconnects providing interfaces between the multiple dielets, and the interfaces forgo interface protocols and input/output protocols between the multiple dielets.

The example method 9000 may pass the native signal between a functional block of the first dielet and one or more functional blocks of one or more other dielets of the multiple dielets through one or more of the native interconnects while forgoing the interface protocols and input/output protocols between the multiple dielets. The native signal may be passed unmodified between the core of the first dielet and the at least one functional block of the second dielet through the circuit spanning across the native interconnect.

The native signal may be level shifted between the core of the first dielet and the at least one functional block of the second dielet through the circuit spanning across the native interconnect, the level shifting to accommodate a difference in operating voltages between the first dielet and the second dielet.

The example method 900 may be implemented in a wafer-to-wafer (W2W) bonding process, for example, wherein the first dielet is on a first wafer and the second dielet is on a second wafer, and wherein the W2W bonding process comprises direct-bonding native core-side conductors of the first dielet with conductors of the second dielet to make native interconnects between the first dielet and the second dielet, the native interconnects extending one or more circuits across a dielet boundary between the first dielet and the second dielet, the one or more circuits spanning across the one or more native interconnects, the native interconnects providing an interface between respective dielets, the interface forgoing interface protocols and input/output protocols between the respective dielets. The first wafer and the second wafer may be fabricated from heterogeneous foundry nodes or the first dielet and the second dielet are fabricated from incompatible manufacturing processes. In an implementation, the example method 900 may direct-bond the native core-side conductors between some parts of the first wafer and the second wafer to make the native interconnects for passing the native signals, but create other interfaces or standard interfaces on other parts of the wafer for passing amplified signals in a microelectronic device resulting from the W2W process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A microelectronics device, comprising:

a flexible substrate having an upper surface including an inorganic dielectric layer and conductive metal pads, the conductive metal pads connected to conductive lines of the flexible substrate; and a plurality of dielets hybrid bonded directly to the inorganic dielectric layer and the conductive metal pads of the flexible substrate;

wherein the plurality of hybrid bonded dielets comprises:

direct-contact metal-to-metal direct-bonds physically coupling and electrically coupling the plurality of hybrid bonded dielets to the conductive lines such that the plurality of hybrid bonded dielets are electrically coupled together via the conductive lines, the direct-contact metal-to-metal direct-bonds comprising directly bonded conductive metal pads in direct contact with one another; and dielectric-to-dielectric bonds between the inorganic dielectric layer and the plurality of hybrid bonded dielets such that dielectrics on each side of an interface are directly bonded together and contact one another; and wherein the inorganic dielectric layer is between the conductive lines and the plurality of hybrid bonded dielets.

2. The microelectronics device of claim 1, wherein the flexible substrate comprises a polymer and an oxide layer on the polymer, wherein the dielectric-to-dielectric bonds are between the oxide layer and the plurality of dielets.

3. The microelectronics device of claim 1, wherein the flexible substrate is stretchable or twistable.

4. The microelectronics device of claim 1, wherein the conductive lines have a pitch of approximately 5 microns or less.

5. The microelectronics device of claim 1, wherein the conductive lines have a pitch of approximately 3 microns or less.

6. The microelectronics device of claim 1, wherein the dielets have footprint dimensions in a range of approximately 0.25×0.25 millimeters to approximately 5.0×5.0 millimeters.

7. The microelectronics device of claim 1, wherein the metal to metal direct-bonds have a pitch of approximately 5 microns or less.

8. The microelectronics device of claim 1, wherein the metal to metal direct-bonds have a pitch of approximately 3 microns or less.

9. The microelectronics device of claim 1, wherein the dielets are coupled to the conductive lines through standard I/O interfaces onboard the dielets.

10. The microelectronics device of claim 1, wherein a material of the flexible substrate is selected from the group consisting of polyethylene terephthalate (PET), heat stabilized PET, polyetheretherketone (PEEK), polyethylene napthalate (PEN), heat stabilized PEN, polycarbonate (PC), polyethersulphone (PES), polyarylate (PAR), polycyclic olefin (PCO), polynorbonene (PNB), and polyimide (PI).

11. The microelectronics device of claim 1, wherein the flexible substrate comprises a bent shape and the conductive lines conform to the bent shape of the flexible substrate.

12. A microelectronics device, comprising:

a substrate comprising a polymer, the substrate having an upper surface including an inorganic dielectric layer comprising an oxide layer and conductive metal pads, the conductive metal pads connected to conductive lines of the substrate; and a plurality of dielets hybrid bonded directly to the inorganic dielectric layer and the conductive metal pads of the substrate;

wherein the plurality of hybrid bonded dielets comprises:

direct-contact metal-to-metal direct-bonds electrically coupling the plurality of hybrid bonded dielets to the conductive lines such that the plurality of hybrid bonded dielets are electrically coupled together via the conductive lines, the direct-contact metal-to-metal direct-bonds comprising directly bonded conductive metal pads in direct contact with one another; and dielectric-to-dielectric bonds between the oxide layer and the plurality of hybrid bonded dielets such that oxide bonds are formed between the oxide layer and the plurality of dielets; and wherein the inorganic dielectric layer is between the conductive lines and the plurality of hybrid bonded dielets.

13. The microelectronics device of claim 12, wherein the substrate comprises a plastic.

14. The microelectronics device of claim 12, wherein a pitch of the conductive lines is approximately 5 microns or less.

15. The microelectronics device of claim 12, wherein a pitch of the conductive lines is approximately 3 microns or less.

16. The microelectronics device of claim 12, wherein a pitch of the metal to metal direct-bonds is approximately 5 microns or less.

17. The microelectronics device of claim 12, wherein a pitch of the metal to metal direct-bonds is approximately 3 microns or less.

18. The microelectronics device of claim 12, wherein the substrate is stretchable or twistable and the conductive lines comprise a stretchable and twistable routing layer.

19. The microelectronics device of claim 12, wherein the conductive lines and the direct-bonds are at a pitch of approximately 5 microns.

20. The microelectronics device of claim 12, wherein the dielets have footprint dimensions in a range of approximately 0.25×0.25 millimeters to approximately 5.0×5.0 millimeters.

21. The microelectronics device of claim 12, wherein the conductive lines and the metal to metal direct-bonds are at a pitch of less than 3 microns.

22. The microelectronics device of claim 12, wherein the dielets are coupled to the conductive lines through standard I/O interfaces onboard the dielets.

23. The microelectronics device of claim 12, wherein the polymer of the substrate is selected from the group consisting of polyethylene terephthalate (PET), heat stabilized PET, polyetheretherketone (PEEK), polyethylene napthalate (PEN), heat stabilized PEN, polycarbonate (PC), polyethersulphone (PES), polyarylate (PAR), polycyclic olefin (PCO), polynorbonene (PNB), and polyimide (PI).

24. The microelectronics device of claim 1, further comprising an encapsulant interspersed between and at least partially encapsulating the dielets.

25. The microelectronics device of claim 1, wherein the dielets are electrically coupled together via the conductive lines through native core-level interconnects of the dielets.

26. The microelectronics device of claim 12, further comprising an encapsulant interspersed between and at least partially encapsulating the dielets.

27. The microelectronics device of claim 12, wherein the dielets are electrically coupled together via the conductive lines through native core-level interconnects of the dielets.

28. The microelectronics device of claim 12, wherein the substrate comprises a bent shape and the conductive lines conform to the bent shape of the substrate.

* * * * *